US011088282B2

(12) United States Patent
Misaki

(10) Patent No.: US 11,088,282 B2
(45) Date of Patent: Aug. 10, 2021

(54) TFT SUBSTRATE, SCANNED ANTENNA HAVING TFT SUBSTRATE, AND METHOD FOR MANUFACTURING TFT SUBSTRATE

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 240 days.

(21) Appl. No.: 16/145,154

(22) Filed: Sep. 27, 2018

(65) Prior Publication Data
US 2019/0097040 A1    Mar. 28, 2019

(30) Foreign Application Priority Data

Sep. 27, 2017 (JP) .............................. JP2017-185917

(51) Int. Cl.
*H01L 29/76*      (2006.01)
*H01L 29/786*     (2006.01)
(Continued)

(52) U.S. Cl.
CPC .......... *H01L 29/786* (2013.01); *G02F 1/1343* (2013.01); *H01L 21/822* (2013.01);
(Continued)

(58) Field of Classification Search
CPC ..... H01L 27/04; H01L 27/124; H01L 29/786; H01L 27/1214
See application file for complete search history.

(56) References Cited

U.S. PATENT DOCUMENTS 7,466,269 B2    12/2008  Haziza
7,847,894 B2    12/2010  Rho
(Continued)

FOREIGN PATENT DOCUMENTS

JP    2002-217640 A    8/2002
JP    2007-116573 A    5/2007
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

*Primary Examiner* — Samuel A Gebremariam
(74) *Attorney, Agent, or Firm* — ScienBiziP, P.C.

(57) ABSTRACT

A TFT substrate includes a plurality of antenna element regions each including a TFT and a patch electrode electrically connected to a drain electrode of the TFT. The TFT substrate further includes a source metal layer including a source electrode of the TFT, a gate metal layer formed on the source metal layer and including a gate electrode of the TFT, a semiconductor layer of the TFT, a gate insulating layer formed between the semiconductor layer and the gate metal layer, wherein the source metal layer further includes the patch electrode. The TFT substrate further includes a source terminal portion arranged in a non-transmitting/receiving region, and the gate metal layer further includes a source terminal upper connection portion of the source terminal portion.

11 Claims, 18 Drawing Sheets

(51) Int. Cl.

| | | |
|---|---|---|
| *G02F 1/1343* | (2006.01) | |
| *H01L 21/822* | (2006.01) | |
| *H01Q 3/44* | (2006.01) | |
| *H01Q 21/06* | (2006.01) | |
| *H01Q 13/22* | (2006.01) | |
| *H01Q 3/34* | (2006.01) | |
| *H01L 27/04* | (2006.01) | |
| *H01L 27/12* | (2006.01) | |
| *H01Q 9/04* | (2006.01) | |

(52) U.S. Cl.
CPC ............ *H01L 27/04* (2013.01); *H01L 27/124* (2013.01); *H01Q 3/34* (2013.01); *H01Q 3/44* (2013.01); *H01Q 9/0442* (2013.01); *H01Q 9/0457* (2013.01); *H01Q 13/22* (2013.01); *H01Q 21/06* (2013.01); *H01Q 21/065* (2013.01)

(56) References Cited

U.S. PATENT DOCUMENTS

| | | |
|---|---|---|
| 2012/0092577 A1 | 4/2012 | Shi et al. |
| 2012/0138922 A1 | 6/2012 | Yamazaki et al. |
| 2012/0194399 A1 | 8/2012 | Bily et al. |
| 2013/0320334 A1 | 12/2013 | Yamazaki et al. |
| 2014/0286076 A1 | 9/2014 | Aoki et al. |
| 2018/0337446 A1* | 11/2018 | Nakazawa ......... H01Q 21/0087 |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |

OTHER PUBLICATIONS

M. Ando et al., "A Radial Line Slot Antenna for 12GHz Satellite Tv Reception", IEEE Transactions of Antennas and Propagation, vol. AP-33, No. 12, pp. 1347-1353 (1985).

M. Wittek et al., "Liquid Crystals for Smart Antennas and Other Microwave Applications", SID 2015 DIGESTpp. 824-826.

Kuki, "New Functional Element Using Liquid Crystal" Polymer, vol. 55, August issue, pp. 599-602 (2006) (A concise explanation of the relevance can be found in paragraph [0052] of the specification of the subject application.

Co-pending letter regarding a related co-pending U.S. Appl. No. 15/542,488, filed Jul. 10, 2017.

Co-pending letter regarding a related co-pending U.S. Appl. no. 16/500,426, filed Oct. 3, 2019.

* cited by examiner

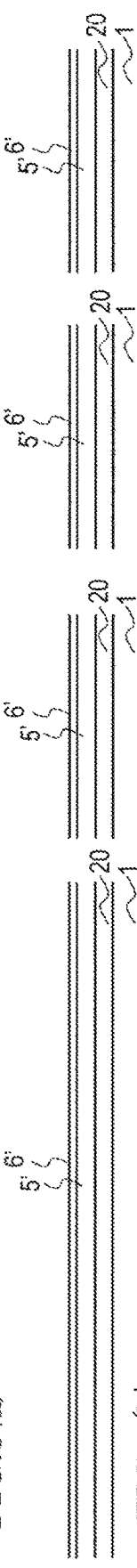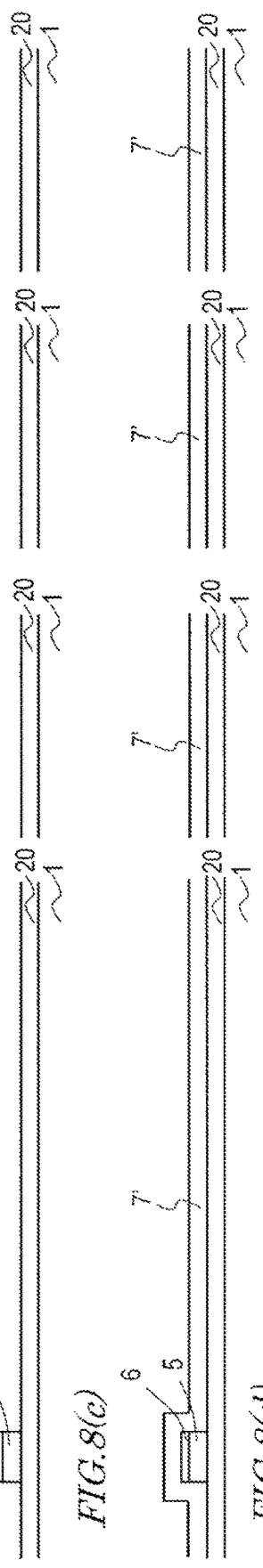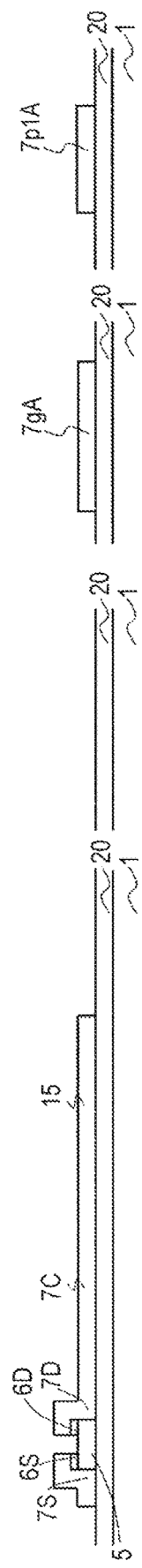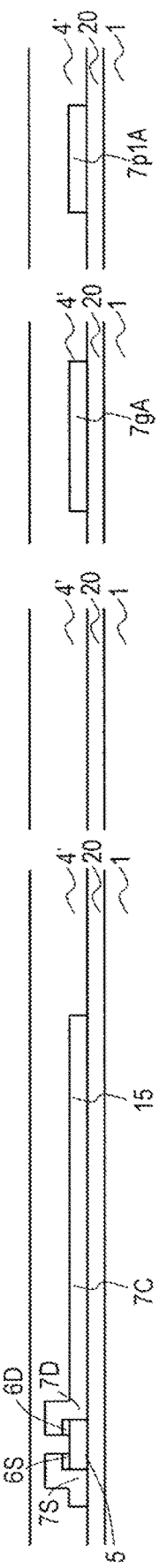

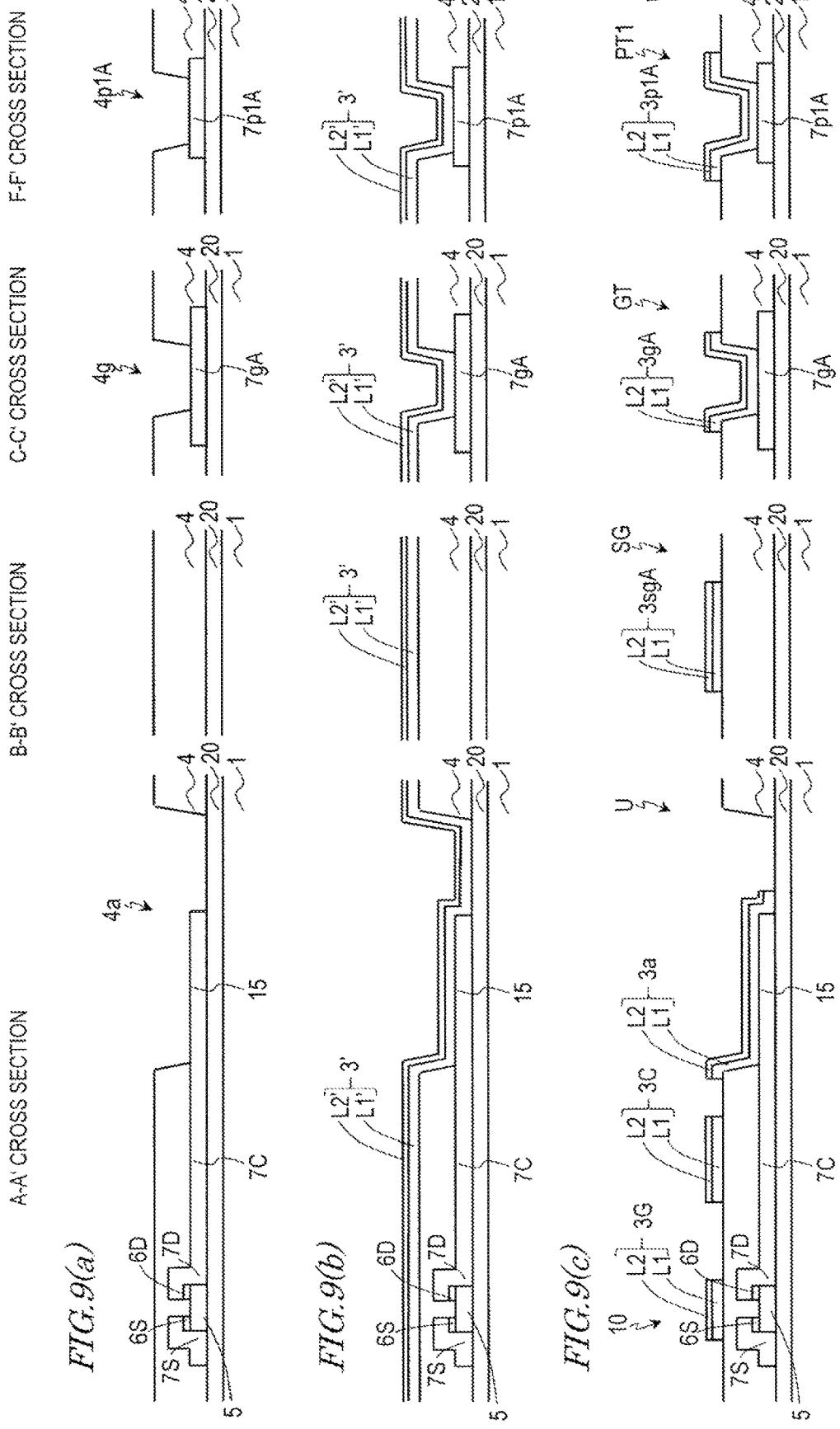

FIG.11(a)
FIG.11(b)
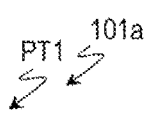
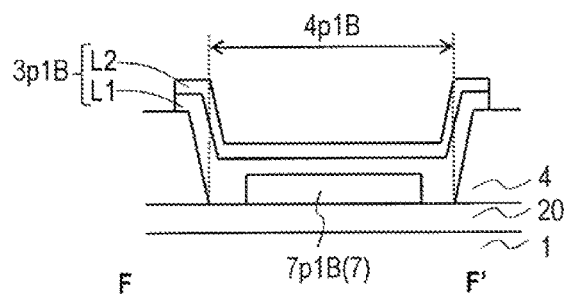
FIG.11(c)
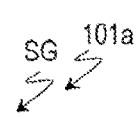
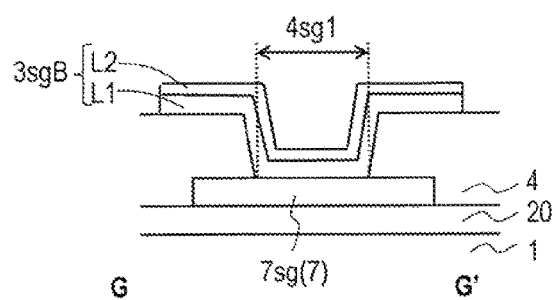
FIG.11(d)
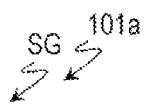
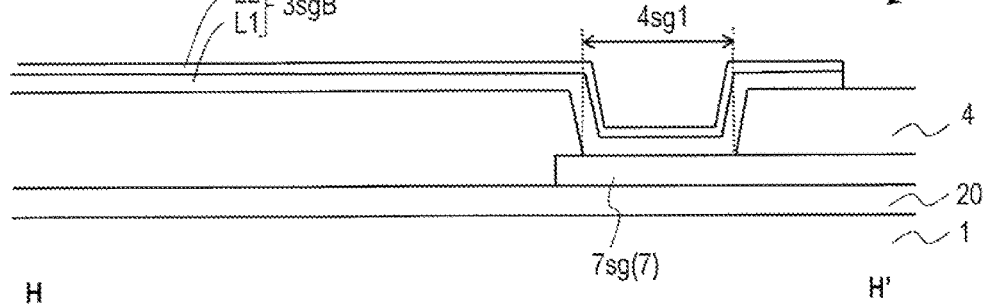

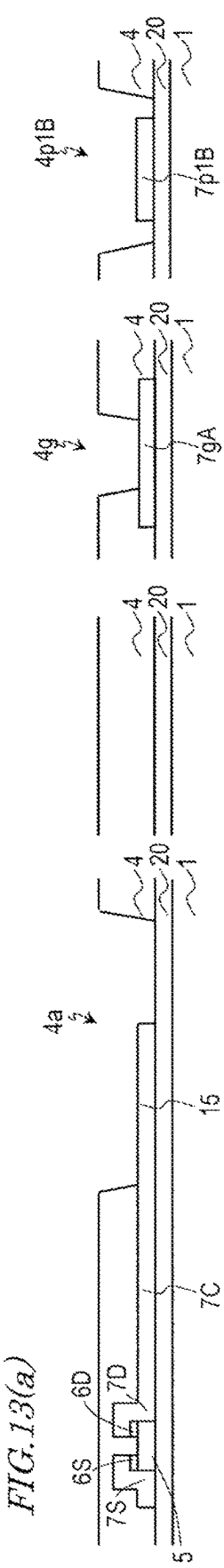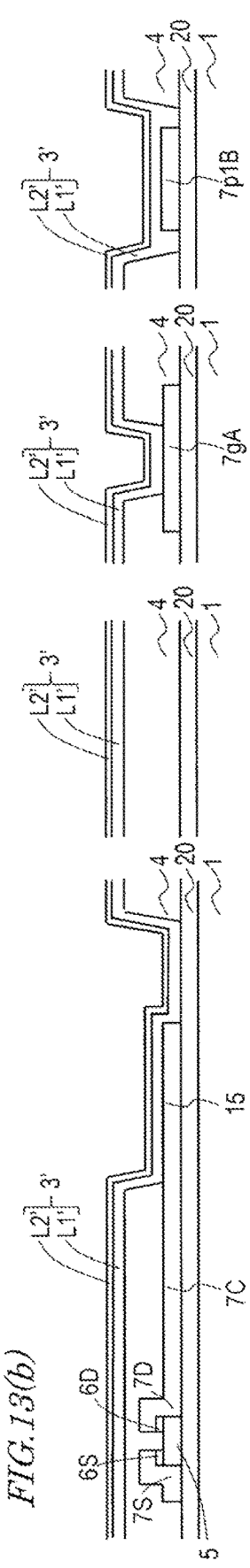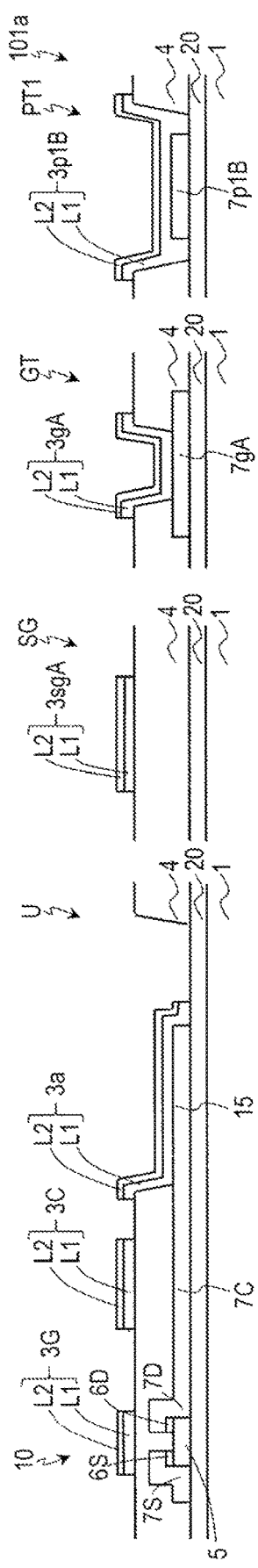

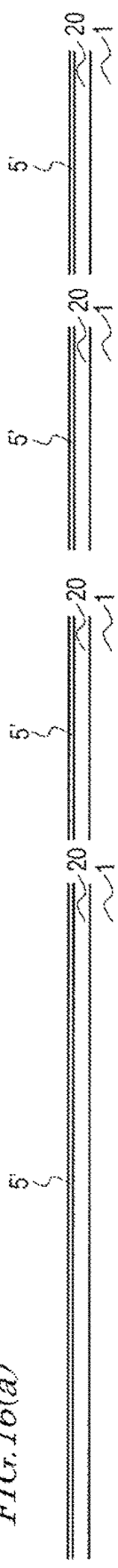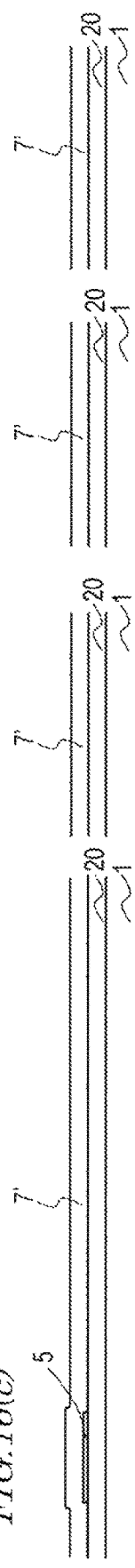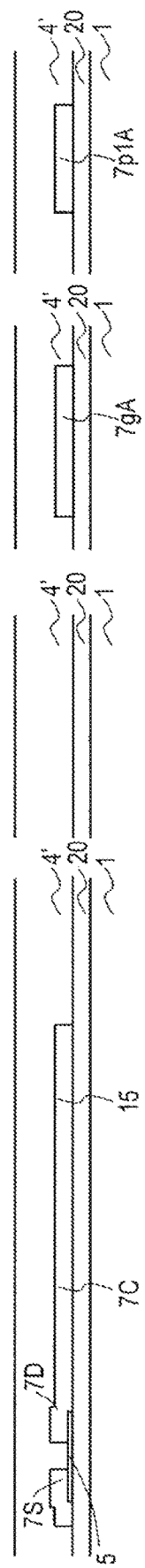

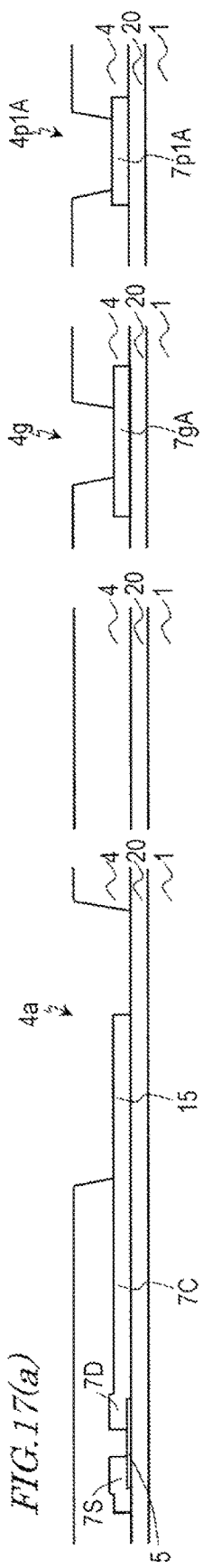

TFT SUBSTRATE, SCANNED ANTENNA HAVING TFT SUBSTRATE, AND METHOD FOR MANUFACTURING TFT SUBSTRATE

BACKGROUND

1. Technical Field

The present invention relates to a scanned antenna, and particularly to a scanned antenna (which may be referred to as a "liquid crystal array antenna") in which each antenna element (which may be referred to as an "element antenna") includes a liquid crystal capacitor, a TFT substrate for use in such a scanned antenna, and a method for manufacturing such a TFT substrate.

2. Description of the Related Art

Antennas for mobile communication and satellite broadcasting applications need to have the capability of changing the beam direction (referred to as "beam scanning" or "beam steering"). As antennas having such a capability (hereinafter referred to as "scanned antennas"), phased array antennas including antenna elements have been known in the art. However, the high cost of conventional phased array antennas has been an obstacle for their widespread application to consumer products. Particularly, the cost increases significantly when the number of antenna elements increases.

In view of this, scanned antennas have been proposed in the art that utilize the high dielectric anisotropy (birefringence) of liquid crystal materials (including nematic liquid crystals and polymer-dispersed liquid crystals) (Japanese Laid-Open Patent Publication Nos. 2007-116573 and 2007-295044, Japanese National Phase PCT Laid-Open Publication Nos. 2009-538565 and 2013-539949, and International Publication WO2015/126550 pamphlet (hereinafter "Patent Document Nos. 1 to 5", respectively), and R. A. Stevenson et al., "Rethinking Wireless Communications: Advanced Antenna Design using LCD Technology", SID 2015 DIGEST, pp. 827-830 (hereinafter "Non-Patent Document No. 1")). The dielectric constant of a liquid crystal material has a frequency dispersion, and the dielectric constant in the microwave frequency band (which may be referred to as the "dielectric constant for microwaves") will be particularly designated as "dielectric constant $M(\varepsilon_M)$" in the present specification.

Patent Document No. 3 and Non-Patent Document No. 1 state that an inexpensive scanned antenna can be realized by using technology for liquid crystal display devices (hereinafter referred to as "LCDs").

The present applicant has developed a scanned antenna capable of being mass-produced by using conventional LCD manufacturing technology. International Publication WO2017/061527 pamphlet (hereinafter "Patent Document No. 6") by the present applicant discloses a scanned antenna capable of being mass-produced by using conventional LCD manufacturing technology, a TFT substrate for use in such a scanned antenna, a method for manufacturing such a scanned antenna and a method for driving such a scanned antenna. The entire content of Patent Document No. 6 is herein incorporated by reference.

SUMMARY

The present inventor studied various structures in order to reduce the cost of the scanned antenna described in Patent Document No. 6. It is an object of the present invention to reduce the cost of a scanned antenna, and to provide a TFT substrate with which it is possible to reduce the cost of a scanned antenna.

A TFT substrate according to an embodiment of the present invention includes: a dielectric substrate; a plurality of antenna element regions arranged on the dielectric substrate, wherein each of the plurality of antenna element regions includes a TFT and a patch electrode electrically connected to a drain electrode of the TFT; a transmitting/receiving region including the plurality of antenna element regions; a non-transmitting/receiving region located outside of the transmitting/receiving region; a source metal layer supported by the dielectric substrate and including a source electrode of the TFT, the drain electrode and a source bus line connected to the source electrode; a gate metal layer formed on the source metal layer and including a gate electrode of the TFT and a gate bus line connected to the gate electrode; a semiconductor layer of the TFT supported by the dielectric substrate; and a gate insulating layer formed between the semiconductor layer and the gate metal layer, wherein: the source metal layer further includes the patch electrode; the source metal layer further includes a source terminal portion arranged in the non-transmitting/receiving region; the source terminal portion includes: a source terminal lower connection portion included in the source metal layer and electrically connected to the source bus line; a first opening formed in the gate insulating layer and reaching the source terminal lower connection portion; and a source terminal upper connection portion connected to the source terminal lower connection portion in the first opening; and the gate metal layer further includes the source terminal upper connection portion.

In one embodiment, the gate metal layer includes a first conductive layer and a second conductive layer formed on the first conductive layer and including a transparent conductive layer, wherein the first conductive layer is formed of a single layer or a layered structure of two or more layers selected from the group consisting of a MoNbNi layer, a MoNb layer, a MoW layer, a W layer, a Ta layer and a Ti layer.

In one embodiment, the source terminal upper connection portion includes the first conductive layer and the second conductive layer; and a side surface of the first conductive layer of the source terminal upper connection portion and a side surface of the second conductive layer of the source terminal upper connection portion are aligned with each other.

In one embodiment, the TFT substrate further includes: a second opening formed in the gate insulating layer so as to reach the patch electrode; and a connection portion covering the patch electrode exposed in the second opening, wherein the gate metal layer further includes the connection portion.

In one embodiment, the connection portion includes the first conductive layer and the second conductive layer; and a side surface of the first conductive layer of the connection portion and a side surface of the second conductive layer of the connection portion are aligned with each other.

In one embodiment, the TFT substrate further includes a gate-source connection portion arranged in the non-transmitting/receiving region, wherein: the gate-source connection portion includes: a gate lower connection line included in the source metal layer and electrically separated from the source bus line; a third opening formed in the gate insulating layer so as to reach the gate lower connection line; and a gate bus line connecting portion included in the gate metal layer, electrically connected to the gate bus line, and connected to the gate lower connection line in the third opening.

In one embodiment, the TFT substrate further includes: a gate terminal portion arranged in the non-transmitting/receiving region, wherein: the gate terminal portion includes: a gate terminal lower connection portion included in the source metal layer and electrically connected to the gate lower connection line; a fourth opening formed in the gate insulating layer so as to reach the gate terminal lower connection portion; and a gate terminal upper connection portion included in the gate metal layer and connected to the gate terminal lower connection portion in the fourth opening.

A scanned antenna according to an embodiment of the present invention includes: any of the TFT substrates set forth above; a slot substrate arranged so as to oppose the TFT substrate; a liquid crystal layer provided between the TFT substrate and the slot substrate; and a reflective conductive plate arranged so as to oppose a surface of the slot substrate that is opposite to the liquid crystal layer with a dielectric layer interposed therebetween, wherein: the TFT substrate further includes a first alignment film covering the gate metal layer; the slot substrate includes a further dielectric substrate, a slot electrode formed on a surface of the further dielectric substrate that is on a side of the liquid crystal layer, and a second alignment film covering the slot electrode; and the slot electrode includes a plurality of slots, and the plurality of slots are arranged so as to respectively correspond to the patch electrodes in the plurality of antenna element regions of the TFT substrate.

A method for manufacturing a TFT substrate according to an embodiment of the present invention is a method for manufacturing any of the TFT substrates set forth above, the method including: a step A of forming a source conductive film on the dielectric substrate; a step B of patterning the source conductive film, thereby forming the source metal layer; a step C of depositing a gate insulating film covering the source metal layer; a step D of etching the gate insulating film, thereby obtaining the gate insulating layer; a step E of forming a gate conductive film on the gate insulating layer; and a step F of patterning the gate conductive film, thereby forming the gate metal layer.

In one embodiment, the step E comprises a step of forming a first conductive film on the gate insulating layer and a step of forming a second conductive film on the first conductive film; and the step F comprises a step of etching the first conductive film and the second conductive film using the same etching mask.

In one embodiment, the first conductive film is formed of a single film or a layered structure of two or more films selected from the group consisting of a MoNbNi film, a MoNb film, a MoW film, a W film, a Ta film and a Ti film; and the second conductive film includes a transparent conductive film.

According to an embodiment of the present invention, it is possible to reduce the cost of a scanned antenna, and it is possible to provide a TFT substrate with which it is possible to reduce the cost of a scanned antenna.

BRIEF DESCRIPTION OF THE DRAWINGS

FIG. 2 includes FIGS. 2(a) and 2(b).

FIG. 4 includes FIGS. 4(a), 4(b), 4(c), 4(d), and 4(e).

FIG. 5 includes FIGS. 5(a), 5(b), and 5(c).

FIG. 7 includes FIGS. 7(a) and 7(b).

FIG. 8 includes FIGS. 8(a), 8(b), 8(c), 8(d), and 8(e). FIGS. 8(a) to 8(e) are schematic cross-sectional views illustrating a method for manufacturing the TFT substrate 101.

FIG. 9 includes FIGS. 9(a), 9(b), and 9(c). FIGS. 9(a) to 9(c) are schematic cross-sectional views illustrating a method for manufacturing the TFT substrate 101.

FIG. 10 is a schematic plan view showing a TFT substrate 101a according to Variation 1. Portion (a) of FIG. 10 is a schematic plan view showing an antenna element region U of the transmitting/receiving region R1 of the TFT substrate 101a, and portions (b) and (c) of FIG. 10 are schematic plan views showing the non-transmitting/receiving region R2 of the TFT substrate 101a.

FIG. 11 includes FIGS. 11(a), 11(b), 11(c), and 11(d). FIGS. 11(a) to 11(d) are schematic cross-sectional views showing the TFT substrate 101a.

FIG. 13 includes FIGS. 13(a), 13(b), and 13(c). FIGS. 13(a) to 13(c) are schematic cross-sectional views illustrating a method for manufacturing the TFT substrate 101a.

FIG. 16 includes FIGS. 16(a), 16(b), 16(c), 16(d), and 16(e). FIGS. 16(a) to 16(e) are schematic cross-sectional views illustrating a method for manufacturing the TFT substrate 101b.

FIG. 17 includes FIGS. 17(a), 17(b), and 17(c). FIGS. 17(a) to 17(c) are schematic cross-sectional views illustrating a method for manufacturing the TFT substrate 101b.

DETAILED DESCRIPTION

Figure 1:
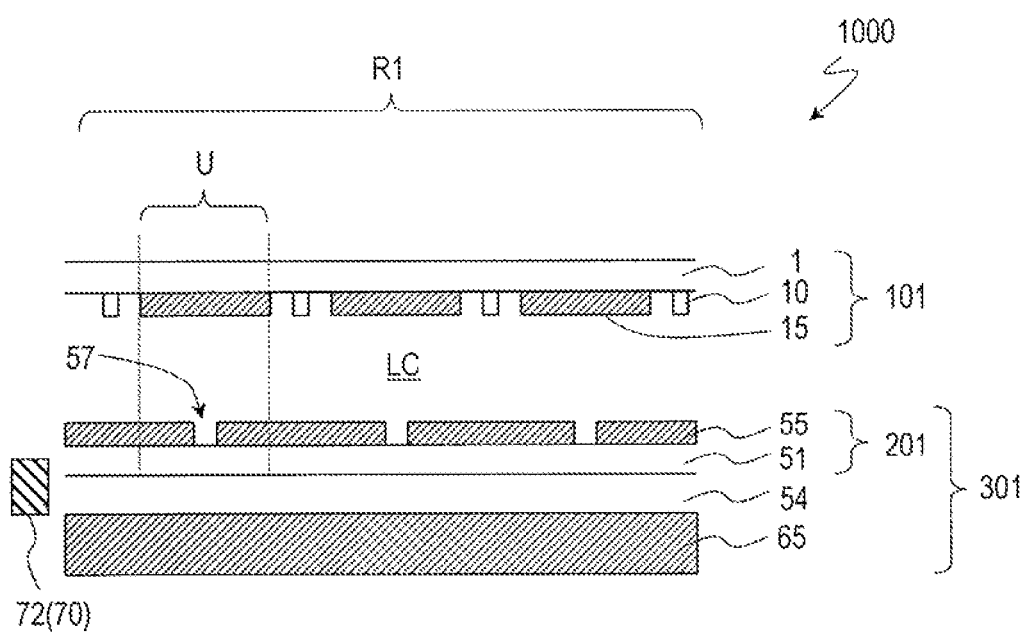
FIG. 1 is a cross-sectional view schematically showing a portion of a scanned antenna 1000 according to an embodiment of the present invention.

A scanned antenna according to an embodiment of the present invention, a method for manufacturing a scanned antenna and a TFT substrate for use in a scanned antenna will be described with reference to the drawings. Note that the present invention is not limited to the embodiments illustrated hereinbelow. The embodiments of the present invention are not restricted to what is shown in the drawings. For example, the thicknesses of layers in cross-sectional views, and sizes of conductive portions and openings in plan views, etc., are illustrative.

<Basic Structure of Scanned Antenna>

With a scanned antenna using antenna elements that utilize the significant dielectric constant $M(\varepsilon_M)$ anisotropy (birefringence) of the liquid crystal material, the voltage to be applied across the liquid crystal layer from each of the antenna elements associated with the pixels of the LCD panel is controlled so as to vary the effective dielectric constant $M(\varepsilon_M)$ of the liquid crystal layer of the various antenna elements, thereby forming a two-dimensional pattern with antenna elements of different static capacitances (corresponding to displaying an image on an LCD). The electromagnetic wave (e.g., microwave) emitted from, or received by, an antenna is given a phase difference depending on the static capacitance of the antenna element, thus realizing a strong directionality toward a particular direction depending on the two-dimensional pattern formed by antenna elements of different static capacitances (beam scanning). For example, the electromagnetic wave emitted from the antenna can be obtained by integrating together spherical waves that are obtained as the input electromagnetic wave is incident upon antenna elements to be scattered by the antenna elements, taking into consideration the phase differences given by the antenna elements. It may be considered that each antenna element is functioning as a "phase shifter". For the basic structure and the operation principle of a scanned antenna using a liquid crystal material, refer to Patent Document Nos. 1 to 4, Non-Patent Document No. 1 and M. ANDO et al., "A Radial Line Slot Antenna for 12 GHz Satellite TV Reception", IEEE Transactions of Antennas and Propagation, Vol. AP-33, No. 12, pp. 1347-1353 (1985) (hereinafter "Non-Patent Document No. 2"). Non-Patent Document No. 2 discloses a basic structure of a scanned antenna having a spiral slot arrangement. The entire disclosures of Patent Document Nos. 1 to 4 and Non-Patent Document Nos. 1 and 2 are herein incorporated by reference.

Note that although the antenna elements of the scanned antenna according to an embodiment of the present invention are similar to pixels of an LCD panel, the structure of an antenna element is different from that of a pixel of an LCD panel, and the arrangement of antenna elements is different from the arrangement of pixels of in an LCD panel. Referring to FIG. 1, which shows a scanned antenna 1000 of a first embodiment to be later described in detail, the basic structure of a scanned antenna according to an embodiment of the present invention will be described. While the scanned antenna 1000 is a radial inline slot antenna including slots arranged in a concentric arrangement, the scanned antenna according to the embodiment of the present invention is not limited thereto, and the arrangement of slots may be any of various arrangements known in the art, for example. Particularly, for the arrangement of slots and/or antenna elements, the disclosure of Patent Document No. 5 is herein incorporated by reference.

Figure 2A:
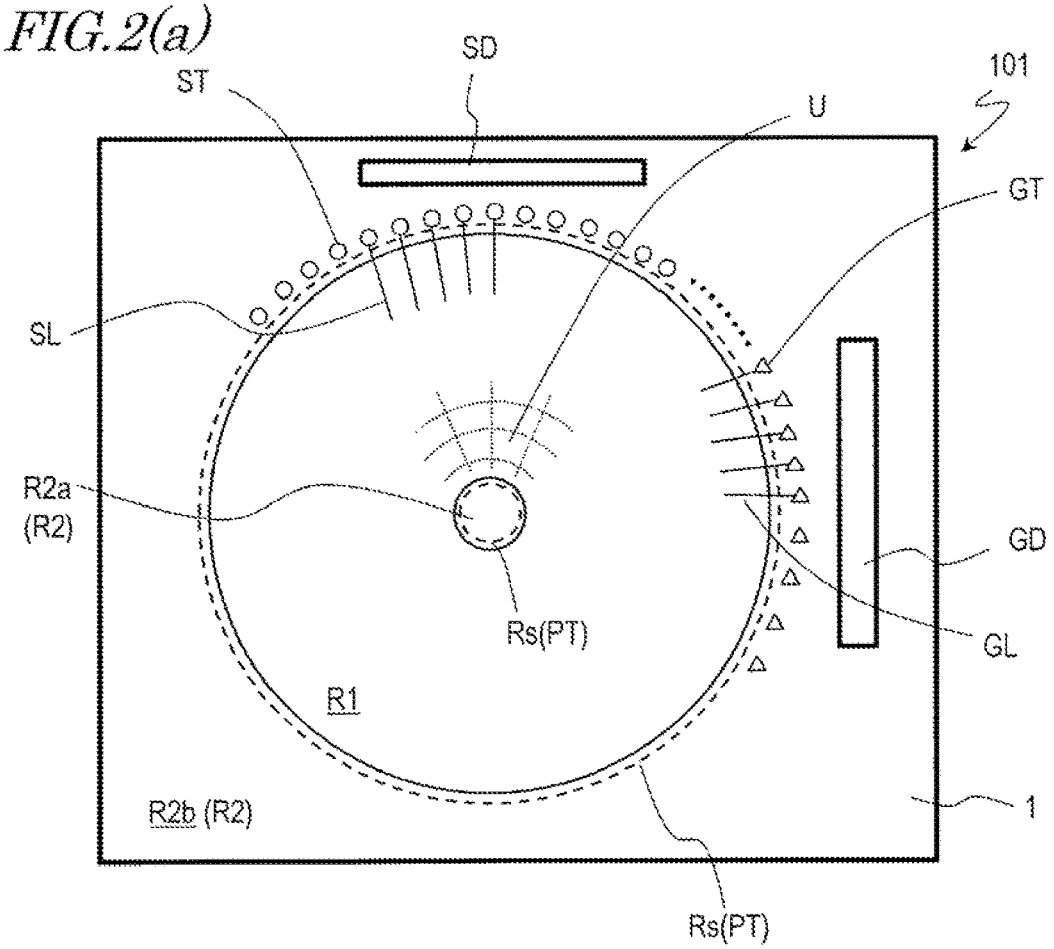
FIGS. 2(a) and 2(b) are schematic plan views showing a TFT substrate 101 and a slot substrate 201, respectively, included in the scanned antenna 1000. A lower-case alphabetical letter in the parentheses after any FIG. number indicates a portion thereof.
Figure 2B:
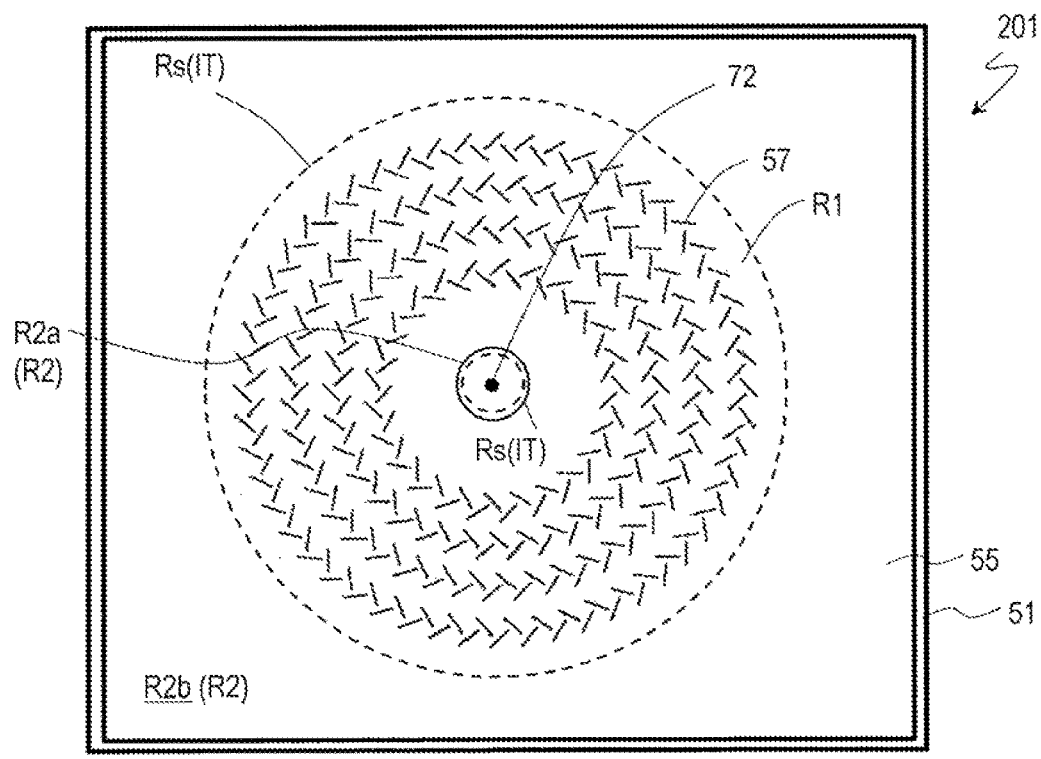

FIG. 1 is a cross-sectional view schematically showing a portion of the scanned antenna 1000 of the present embodiment, schematically showing a portion of a cross section extending in the radial direction from a power feed pin 72 (see FIG. 2(b)) provided at around the center of slots arranged in a concentric arrangement.

The scanned antenna 1000 includes a TFT substrate 101, a slot substrate 201, a liquid crystal layer LC arranged therebetween, and a reflective conductive plate 65 arranged so as to oppose the slot substrate 201 with an air layer 54 interposed therebetween. The scanned antenna 1000 transmits/receives microwaves from the TFT substrate 101 side.

The TFT substrate 101 includes a dielectric substrate 1, such as a glass substrate, and a plurality of patch electrodes 15 and a plurality of TFTs 10 formed on the dielectric substrate 1. The patch electrodes 15 are connected to the corresponding TFTs 10. Each TFT 10 is connected to a gate bus line and a source bus line.

The slot substrate 201 includes a dielectric substrate 51, such as a glass substrate, and a slot electrode 55 formed on the liquid crystal layer LC side of the dielectric substrate 51. The slot electrode 55 includes a plurality of slots 57.

The reflective conductive plate 65 is arranged so as to oppose the slot substrate 201 with the air layer 54 interposed therebetween. A layer formed by a dielectric (e.g., a fluororesin such as PTFE) having a small dielectric constant M for microwaves can be used instead of the air layer 54. The slot electrode 55, the reflective conductive plate 65, and the dielectric substrate 51 and the air layer 54 therebetween together function as a waveguide 301.

The patch electrode 15, a portion of the slot electrode 55 including the slot 57, and the liquid crystal layer LC therebetween together form the antenna element U. In each antenna element U, one patch electrode 15 opposes a portion of the slot electrode 55 including one slot 57 with the liquid crystal layer LC interposed therebetween, thereby forming a liquid crystal capacitor. Each antenna element U includes a storage capacitor (see FIG. 3, for example) connected electrically parallel to the liquid crystal capacitor. The antenna element U of the scanned antenna 1000 has a similar structure to that of the pixel of the LCD panel. However, the scanned antenna 1000 has many differences from the LCD panel.

First, the capacity required for the dielectric substrates 1 and 51 of the scanned antenna 1000 is different from that required for substrates of an LCD panel.

Typically, an LCD panel uses substrates that are transparent to visible light, e.g., a glass substrate or a plastic substrate. In a reflective-type LCD panel, the substrate on the back side needs no transparency, and therefore a semiconductor substrate may be used. In contrast, the dielectric substrates 1 and 51 of an antenna preferably have a small dielectric loss for microwaves (the dielectric loss tangent for microwaves will be denoted as $\tan\delta_M$). $\text{Tan}\delta_M$ of the dielectric substrates 1 and 51 is preferably about 0.03 or less, and more preferably 0.01 or less. Specifically, a glass substrate or a plastic substrate may be used. A glass substrate has a better dimensional stability and a better heat resistance than a plastic substrate, and it is suitable for cases in which circuit elements such as TFTs, lines and electrodes are formed by using the LCD technology. For example, when the materials forming the waveguide are the air and a glass, it is preferably 400 μm or less and more preferably 300 μm or less since a glass has a greater dielectric loss and the waveguide loss can be reduced as the glass is thinner. There is no particular lower limit as long as it can be handled without being cracked during the manufacturing process.

The conductive material used for the electrode also varies. An ITO film is often used as the transparent conductive film for the pixel electrode and the counter electrode of an LCD panel. However, ITO has a large $\tan\delta_M$ for microwaves, and it cannot be used as the conductive layer in an antenna. The slot electrode 55 functions as a wall of the waveguide 301, together with the reflective conductive plate 65. Therefore, in order to suppress the transmission of microwaves through the wall of the waveguide 301, the thickness of the wall of the waveguide 301, i.e., the thickness of the metal layer (a Cu layer or an Al layer), is preferably large. It is known in the art that the electromagnetic wave is attenuated to $\frac{1}{20}$ (−26 dB) when the thickness of the metal layer is three times the skin depth, and the electromagnetic wave is attenuated to about $\frac{1}{150}$ (−43 dB) when it is five times the skin depth. Therefore, it is possible to reduce the transmittance of electromagnetic waves to 1% if the thickness of the metal layer is five times the skin depth. For 10 GHz microwaves, for example, it is possible to reduce the microwaves to $\frac{1}{150}$ by using a Cu layer whose thickness is 3.3 μm or more and an Al layer whose thickness is 4.0 μm or more. For 30 GHz microwaves, it is possible to reduce the microwaves to $\frac{1}{150}$ by using a Cu layer whose thickness is 1.9 μm or more and an Al layer whose thickness is 2.3 μm or more. Thus, the slot electrode 55 is preferably formed from a Cu layer or an Al layer which is relatively thick. There is no particular upper limit to the thickness of the Cu layer or the Al layer, and the thickness may be set appropriately in view of the deposition time and cost. Using a Cu layer gives an advantage that it can be made thinner than when an Al layer is used. For the formation of a Cu layer or an Al layer which is relatively thick, it is possible to employ not only the thin film deposition method used in LCD manufacturing processes, but also other methods such as attaching a Cu foil or an Al foil to the substrate. The thickness of the metal layer is 2 μm or more and 30 μm or less, for example. When it is formed by using the thin film deposition method, the thickness of the metal layer is preferably 5 μm or less. Note that the reflective conductive plate 65 may be an aluminum plate, a copper plate, or the like, having a thickness of some mm, for example.

The patch electrode 15 may be a Cu layer or an Al layer whose thickness is smaller than the slot electrode 55 because it does not form the waveguide 301 as does the slot electrode 55. Note however that in order to avoid a loss that transforms into heat when the oscillation of free electrons near slots 57 of the slot electrode 55 is induced into the oscillation of free electrons in the patch electrode 15, it is preferred that the resistance is low. In view of mass production, it is preferred to use an Al layer rather than a CU layer, and the thickness of the Al layer is preferably 0.3 μm or more and 2 μm or less, for example.

The pitch with which the antenna elements U are arranged is significantly different from the pixel pitch. For example, for an antenna for 12 GHz (Ku band) microwaves, the wavelength λ is 25 mm, for example. Then, as described in Patent Document No. 4, the pitch of the antenna elements U is λ/4 or less and/or λ/5 or less, i.e., 6.25 mm or less and/or 5 mm or less. This is 10 times or more the pitch of the pixels of an LCD panel. Thus, the length and the width of the antenna elements U are about 10 times those of the pixel lengths of an LCD panel.

It is understood that the arrangement of the antenna elements U may be different from the arrangement of pixels in an LCD panel. An example of a concentric arrangement (see, for example, Japanese Laid-Open Patent Publication No. 2002-217640) will be illustrated herein, but the arrangement is not limited thereto, and it may be a spiral arrangement as described in Non-Patent Document No. 2, for example. Moreover, it may be a matrix arrangement as described in Patent Document No. 4.

Characteristics required for the liquid crystal material of the liquid crystal layer LC of the scanned antenna 1000 are different from those required for the liquid crystal material of an LCD panel. An LCD panel produces display by giving a phase difference to the polarization of visible light (wavelength 380 nm to 830 nm) by changing the refractive index of the liquid crystal layer of each pixel, thereby changing the polarization thereof (e.g., rotating the polarization axis direction of linearly-polarized light or changing the degree of circular polarization of circularly-polarized light). In contrast, the scanned antenna 1000 according to the embodiment varies the phase of the microwave to be driven (re-radiated) from each patch electrode by changing the static capacitance value of the liquid crystal capacitor of the antenna element U. Therefore, with a liquid crystal layer, the anisotropy ($\Delta\varepsilon_M$) of the dielectric constant M($\varepsilon_M$) for microwaves is preferably large, and $\tan\delta_M$ is preferably small. For example, one whose $\Delta\varepsilon_M$ is 4 or more and whose $\tan\delta_M$ is 0.02 or less (each being a value for 9 Gz) described in M. Wittek et al., SID 2015 DIGEST, pp. 824-826 can suitably be used. In addition, a liquid crystal material whose $\Delta\varepsilon_M$ is 0.4 or more and whose $\tan\delta_M$ is 0.04 or less described in Kuki, Polymer, vol. 55, August issue, pp. 599-602 (2006) can be used.

Typically, the dielectric constant of a liquid crystal material has a frequency dispersion, and the dielectric anisotropy $\Delta\varepsilon_M$ for microwaves has a positive correlation with the refractive index anisotropy Δn for visible light. Therefore, it can be said that a liquid crystal material of an antenna element for microwaves is preferably a material having a large refractive index anisotropy Δn for visible light. The refractive index anisotropy Δn of a liquid crystal material for an LCD is evaluated by the refractive index anisotropy for light of 550 nm. Also using Δn (birefringence) for light of 550 nm herein as the index, a nematic liquid crystal whose Δn is 0.3 or more, preferably 0.4 or more, can be used for an antenna element for microwaves. There is no particular upper limit to Δn. Note however that a liquid crystal material having a large Δn tends to have a strong polarity, and may possibly lower the reliability. In view of the reliability, Δn is preferably 0.4 or less. The thickness of the liquid crystal layer is 1 μm to 500 μm, for example.

The structure of a scanned antenna according to an embodiment of the present invention and a method for manufacturing the same will now be described in detail.

First, reference will be made to FIG. 1 and FIG. 2. FIG. 1 is a schematic partial cross-sectional view at around the center of the scanned antenna 1000 as described in detail above, and FIGS. 2(*a*) and 2(*b*) are schematic plan views showing the TFT substrate 101 and the slot substrate 201, respectively, of the scanned antenna 1000.

The scanned antenna 1000 includes a plurality of antenna elements U arranged in a two-dimensional arrangement, and the scanned antenna 1000 illustrated herein includes a plurality of antenna elements arranged in a concentric arrangement. In the following description, the region of the TFT substrate 101 or the slot substrate 201 corresponding to the antenna element U will be referred to as an "antenna element region" and will be denoted by the same reference sign U as the antenna element. As shown in FIGS. 2(a) and 2(b), in the TFT substrate 101 and the slot substrate 201, a region defined by a plurality of antenna element regions arranged in a two-dimensional arrangement will be referred to as a "transmitting/receiving region R1", and regions other than the transmitting/receiving region R1 will be referred to as "non-transmitting/receiving regions R2". A terminal portion, a driving circuit, etc., are provided in the non-transmitting/receiving regions R2.

FIG. 2(a) is a schematic plan view showing the TFT substrate 101 of the scanned antenna 1000.

In the illustrated example, as seen from the direction normal to the TFT substrate 101, the transmitting/receiving region R1 is donut-shaped. The non-transmitting/receiving regions R2 include a first non-transmitting/receiving region R2a located at the center portion of the transmitting/receiving region R1 and a second non-transmitting/receiving region R2b located at the peripheral portion of the transmitting/receiving region R1. The outer diameter of the transmitting/receiving region R1 is 200 mm to 1500 mm, for example, and may be set based on the traffic volume, or the like.

The transmitting/receiving region R1 of the TFT substrate 101 includes a plurality of gate bus lines GL and a plurality of source bus lines SL supported on the dielectric substrate 1, and the antenna element regions U are defined by these lines. The antenna element regions U are arranged in a concentric arrangement, for example, in the transmitting/receiving region R1. Each of the antenna element regions U includes a TFT, and a patch electrode electrically connected to the TFT. The source electrode of a TFT and the gate electrode thereof are electrically connected to a source bus line SL and the gate bus line GL, respectively. The drain electrode is electrically connected to the patch electrode.

A seal region Rs is arranged in the non-transmitting/receiving region R2 (R2a, R2b) so as to surround the transmitting/receiving region R1. A sealant (not shown) is provided in the seal region Rs. The sealant bonds together the TFT substrate 101 and the slot substrate 201, and also seals the liquid crystal between these substrates 101 and 201.

The gate terminal portion GT, the gate driver GD, the source terminal portion ST and the source driver SD are provided in the non-transmitting/receiving region R2 outside the seal region Rs. The gate bus lines GL are connected to the gate driver GD via the gate terminal portions GT. The source bus lines SL are connected to the source driver SD via the source terminal portions ST. Note that although the source driver SD and the gate driver GD are formed on the dielectric substrate 1 in this example, one or both of these drivers may be provided on another dielectric substrate.

A plurality of transfer terminal portions PT are also provided in the non-transmitting/receiving region R2. The transfer terminal portions PT are electrically connected to the slot electrode 55 of the slot substrate 201 (FIG. 2(b)). In the present specification, the connecting portion between the transfer terminal portion PT and the slot electrode 55 will be referred to as a "transfer portion". As shown in the figure, the transfer terminal portions PT (transfer portions) may be arranged in the seal region Rs. In this case, a resin containing conductive particles therein may be used as the sealant. Thus, it is possible to seal the liquid crystal between the TFT substrate 101 and the slot substrate 201, and to ensure an electrical connection between the transfer terminal portion PT and the slot electrode 55 of the slot substrate 201. Although the transfer terminal portions PT are arranged both in the first non-transmitting/receiving region R2a and in the second non-transmitting/receiving region R2b in this example, the transfer terminal portions PT may be arranged either one of these regions.

Note that the transfer terminal portions PT (transfer portions) may not be arranged in the seal region Rs. For example, they may be arranged outside the seal region Rs in the non-transmitting/receiving region R2.

FIG. 2(b) is a schematic plan view illustrating the slot substrate 201 of the scanned antenna 1000, showing the liquid crystal layer LC side surface of the slot substrate 201.

On the slot substrate 201, the slot electrode 55 is formed on the dielectric substrate 51 across the transmitting/receiving region R1 and the non-transmitting/receiving region R2.

A plurality of slots 57 are arranged in the slot electrode 55 in the transmitting/receiving region R1 of the slot substrate 201. The slots 57 are arranged so as to correspond to the antenna element regions U on the TFT substrate 101. In the illustrated example, pairs of slots 57 are arranged in a concentric arrangement, each pair including slots 57 extending in directions generally orthogonal to each other so as to implement a radial inline slot antenna. Having slots generally orthogonal to each other, the scanned antenna 1000 is capable of transmitting/receiving circularly-polarized waves.

A plurality of terminal portions IT of the slot electrode 55 are provided in the non-transmitting/receiving region R2. The terminal portions IT are electrically connected to the transfer terminal portions PT of the TFT substrate 101 (FIG. 2(a)). In this example, the terminal portions IT are arranged in the seal region Re, and are electrically connected to the corresponding transfer terminal portions PT by a sealant containing conductive particles therein.

In the first non-transmitting/receiving region R2a, the power feed pin 72 is arranged on the reverse side of the slot substrate 201. With the power feed pin 72, microwaves are inserted into the waveguide 301 formed by the slot electrode 55, the reflective conductive plate 65 and the dielectric substrate 51. The power feed pin 72 is connected to a power feed device 70. The power is fed from the center of the concentric arrangement in which the slots 57 are arranged. The power feeding method may be either a direct power feed method or an electromagnetic coupling method, and a power feed structure known in the art can be employed.

In FIGS. 2(a) and 2(b), the seal region Rs is shown to be provided so as to surround a relatively small region that includes the transmitting/receiving region R1, but the present invention is not limited to this. Particularly, the seal region Rs, which is provided outside the transmitting/receiving region R1, may be provided in the vicinity of the sides of the dielectric substrate 1 and/or the dielectric substrate 51, for example, so that the distance from the transmitting/receiving region R1 is equal to a predetermined distance or more. Needless to say, a terminal portion and a driving circuit, for example, provided in the non-transmitting/receiving region R2, may be formed outside the seal region Rs (i.e., on the side where the liquid crystal layer is absent). By locating the seal region Rs with a predetermined distance or more from the transmitting/receiving region R1, it is possible to suppress the lowering of the antenna property due to an influence from an impurity (particularly, an ionic impurity) included in a sealant (particularly, a curable resin).

The structure of the scanned antenna 1000 will now be described in greater detail.

<Structure of TFT Substrate 101>

A TFT substrate for use in a scanned antenna according to an embodiment of the present invention includes a TFT having a top gate structure, and includes a patch electrode formed in a source metal layer. The TFT substrate for use in a scanned antenna according to the embodiment of the present invention can be manufactured in a smaller number of steps (e.g., a smaller number of photomasks) than a TFT substrate of a scanned antenna of Patent Document No. 6. With the TFT substrate for use in a scanned antenna according to the embodiment of the present invention, it is possible to reduce the cost of the scanned antenna while suppressing the lowering of the antenna performance.

Figure 3:
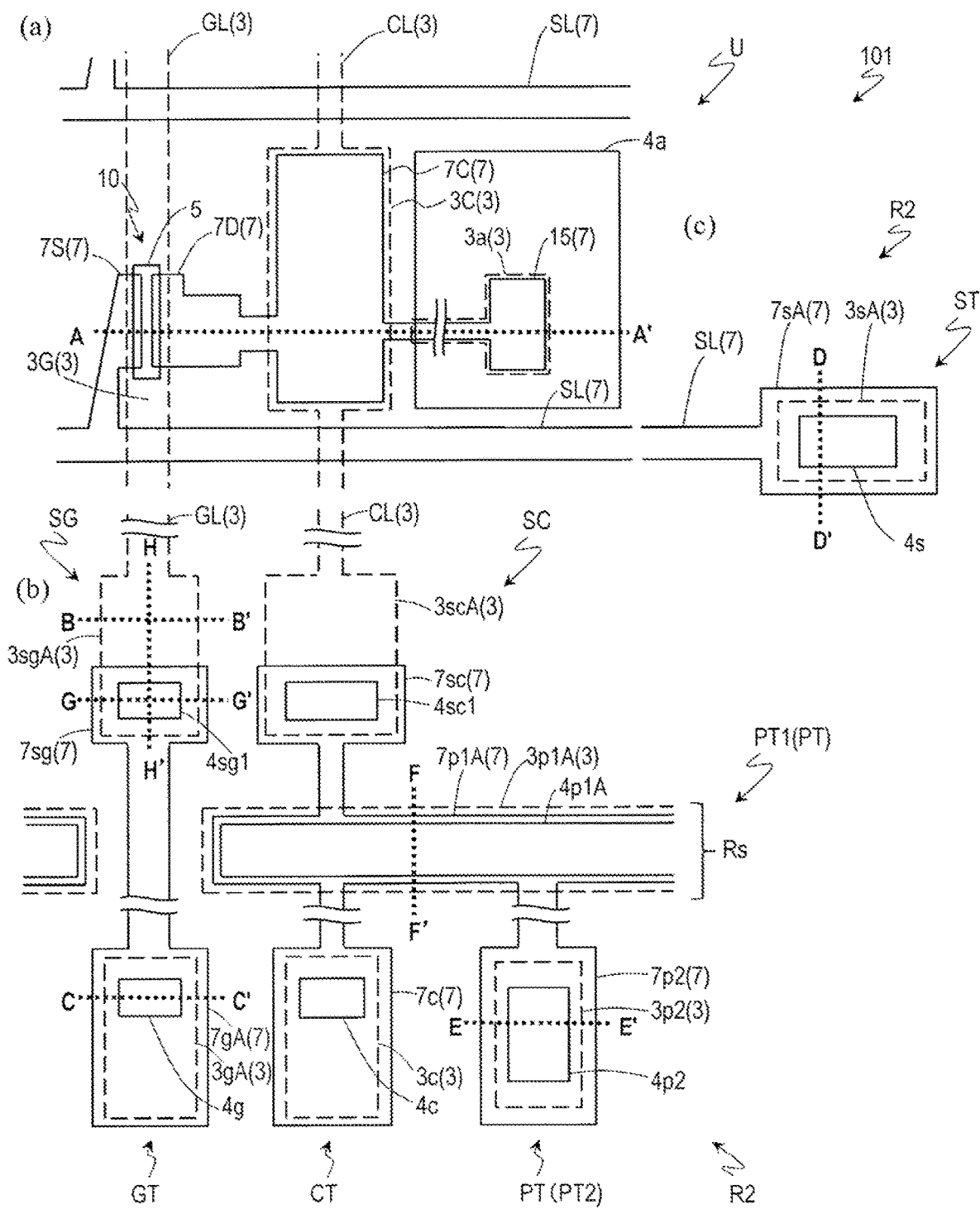
FIG. 3 is a schematic plan view showing the TFT substrate 101. Portion (a) of FIG. 3 is a schematic plan view showing an antenna element region U of a transmitting/receiving region R1 of the TFT substrate 101, and portions (b) and (c) of FIG. 3 are schematic plan views showing a non-transmitting/receiving region R2 of the TFT substrate 101.

Referring to FIG. 3 to FIG. 5, the structure of the TFT substrate 101 of the scanned antenna 1000 will be described.

Figure 4A:
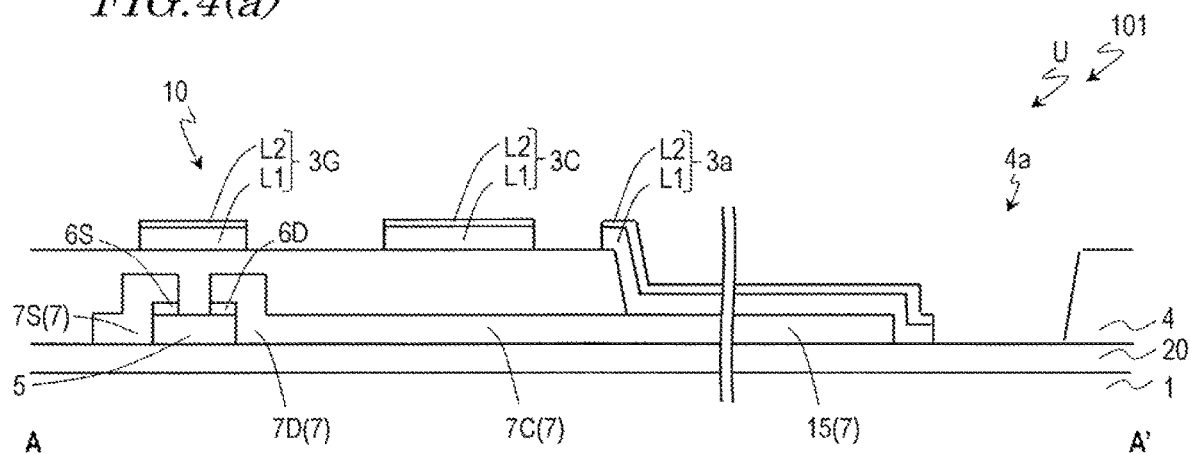
FIG. 4(a) is a schematic cross-sectional view showing the transmitting/receiving region R1 of the TFT substrate 101.

Portions (a) to (c) of FIG. 3 are schematic plan views showing the TFT substrate 101, and FIGS. 4(a) to 4(e) and FIGS. 5(a) to 5(c) are schematic cross-sectional views showing the TFT substrate 101. Portion (a) of FIG. 3 shows a schematic plan view of the transmitting/receiving region R1 of the TFT substrate 101, and portions (b) and (c) of FIG. 3 show schematic plan views of the non-transmitting/receiving region R2 of the TFT substrate 101. FIG. 4(a) shows a schematic cross-sectional view of the transmitting/receiving region R1 of the TFT substrate 101, and FIGS. 4(b) to 4(e) and FIGS. 5(a) to 5(c) show schematic cross-sectional views of the non-transmitting/receiving region R2 of the TFT substrate 101.

As described above, the TFT substrate 101 includes the transmitting/receiving region R1 where a plurality of antenna element regions U are arranged, and the non-transmitting/receiving region R2 where a terminal portion, etc., are provided. The non-transmitting/receiving region R2 includes the seal region Rs provided so as to surround the transmitting/receiving region R1. The seal region Rs is located between the terminal portion region where terminal portions are arranged and the transmitting/receiving region R1, for example.

Portion (a) of FIG. 3 shows the antenna element region U of the transmitting/receiving region R1, portion (b) of FIG. 3 shows the gate terminal portion GT, the CS terminal portion CT, the transfer terminal portion PT, the gate-source connecting portion SG and the CS-source connecting portion SC provided in the non-transmitting/receiving region R2, and portion (c) of FIG. 3 shows the source terminal portion ST provided in the non-transmitting/receiving region R2. A transfer terminal portion (referred to also as a "transfer portion") PT includes a first transfer terminal portion PT1 located in the seal region Rs, and a second transfer terminal portion PT2 provided outside (the opposite side from the liquid crystal layer) the seal region Rs. In this example, the first transfer terminal portion PT1 extends along the seal region Rs so as to surround the transmitting/receiving region R1.

Typically, the gate terminal portion GT and the source terminal portion ST are provided for each gate bus line and for each source bus line, respectively. The gate-source connecting portions SG typically provided so as to correspond to the source bus lines. While portion (b) of FIG. 3 shows the CS terminal portion CT and the second transfer terminal portion PT2 side by side with the gate terminal portion GT, the number and arrangement of the CS terminal portions CT and the second transfer terminal portions PT2 are each set independently of the gate terminal portions GT. Normally, the number of CS terminal portions CT and the number of second transfer terminal portions PT2 are smaller than the number of gate terminal portions GT, and are set appropriately taking into consideration the voltage uniformity of the CS electrode and the slot electrode. The second transfer terminal portions PT2 may be omitted if the first transfer terminal portion PT1 is present.

The CS terminal portions CT are provided corresponding respectively to the CS bus lines, for example. The CS terminal portions CT may be provided so that each CS terminal portion CT corresponds to a plurality of CS bus lines. For example, when the same voltage as the slot voltage is supplied to the CS bus lines, the TFT substrate 101 may include at least one CS terminal portion CT. Note however that in order to lower the wiring resistance, the TFT substrate 101 preferably includes a plurality of CS terminal portions CT. Note that the slot voltage is the ground potential, for example. When the same voltage as the slot voltage is supplied to the CS bus lines, either the CS terminal portions CT or the second transfer terminal portions PT2 may be omitted.

Figure 4B:
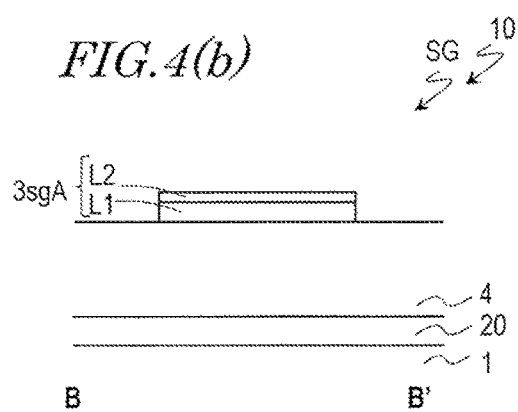
FIGS. 4(b) to 4(e) are schematic cross-sectional views showing the non-transmitting/receiving region R2 of the TFT substrate 101.
Figure 4C:
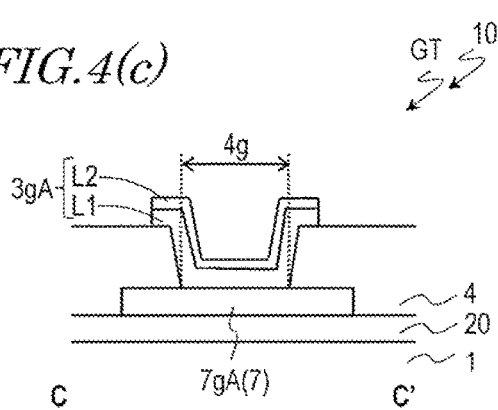
Figure 4D:
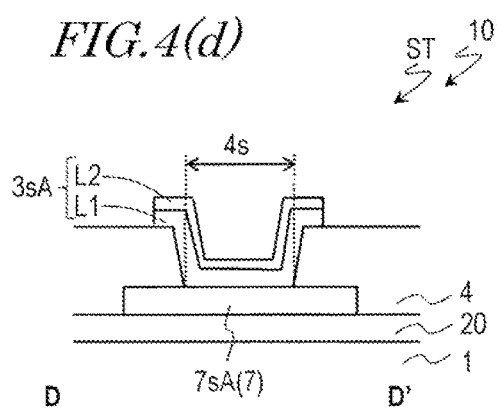
Figure 4E:
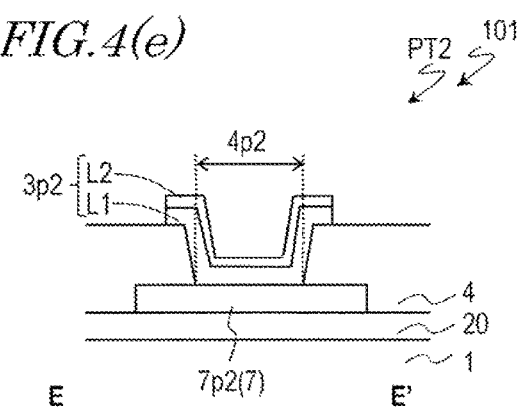
Figure 5A:
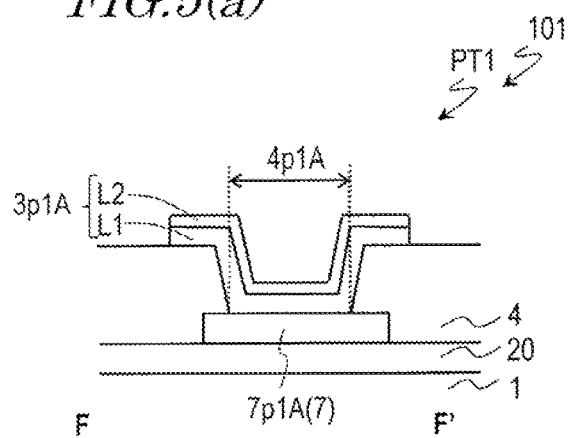
FIGS. 5(a) to 5(c) are schematic cross-sectional views showing the non-transmitting/receiving region R2 of the TFT substrate 101.
Figure 5B:
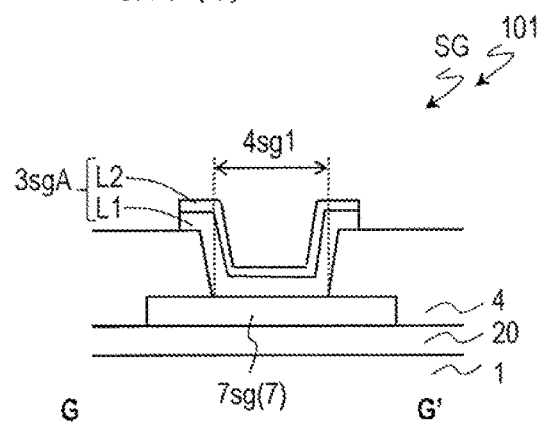
Figure 5C:
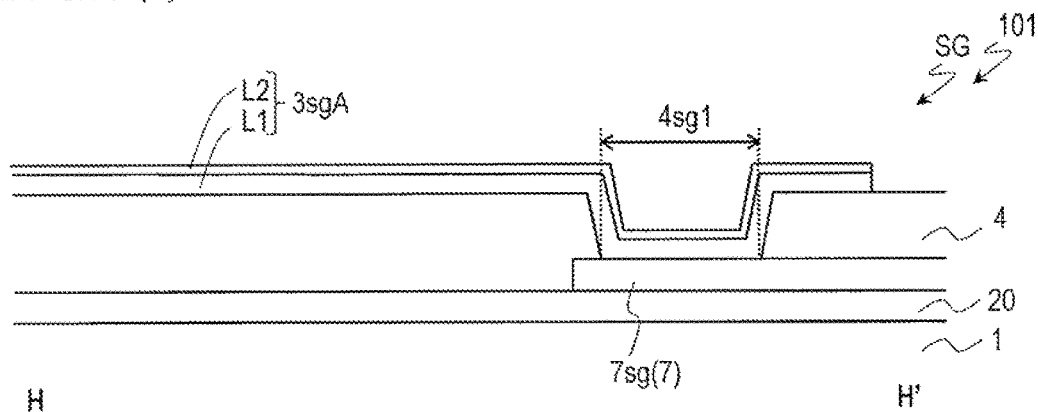

FIG. 4(a) shows a cross section of the antenna element region U taken along line A-A' of portion (a) of FIG. 3, FIG. 4(b) a cross section of the gate-source connecting portion SG taken along line B-B' of portion (b) of FIG. 3, FIG. 4(c) a cross section of the gate terminal portion GT taken along line C-C' of portion (b) of FIG. 3, FIG. 4(d) a cross section of the source terminal portion ST taken along line D-D' of portion (c) of FIG. 3, FIG. 4(e) a cross section of the second transfer terminal portion PT2 taken along line E-E' of portion (b) of FIG. 3, FIG. 5(a) a cross section of the first transfer terminal portion PT1 taken along line F-F' of portion (b) of FIG. 3, FIG. 5(b) a cross section of the gate-source connecting portion SG taken along line G-G' of portion (b) of FIG. 3, and FIG. 5(c) a cross section of the gate-source connecting portion SG taken along line H-H' of portion (b) of FIG. 3.

Antenna Element Region U

As shown in portion (a) of FIG. 3 and FIG. 4(a), each antenna element region U of the TFT substrate 101 includes a TFT 10 and a patch electrode 15 connected to a drain electrode 7D of the TFT 10.

As shown in FIG. 3 to FIG. 5, the TFT substrate 101 includes a source metal layer 7 supported by the dielectric substrate 1, a gate metal layer 3 formed on the source metal layer 7, and a gate insulating layer 4 formed between the source metal layer 7 and the gate metal layer 3. The patch electrode 15 is included in the source metal layer 7. That is, the patch electrode 15 is formed of the same conductive layer as a source electrode 7S of the TFT 10.

The TFT 10 of each antenna element region U includes a gate electrode 3G, an island-shaped semiconductor layer 5, contact layers 6S and 6D, the gate insulating layer 4 arranged between the gate electrode 3 and the semiconductor layer 5, and the source electrode 7S and the drain electrode 7D. The TFT 10 has a top gate structure. That is, the gate electrode 3G is arranged above the semiconductor layer 5 with the gate insulating layer 4 therebetween.

The gate electrode 3G is electrically connected to the gate bus line GL, and receives a scanning signal voltage supplied from the gate bus line GL. The source electrode 7S is electrically connected to the source bus line SL, and receives a data signal voltage supplied from the source bus line SL. In this example, the gate electrode 3G and the gate bus line GL are formed of the same conductive film (gate conductive film). Herein, the source electrode 7S, the drain electrode 7D and the source bus line SL are formed of the same conductive film (source conductive film). The gate conductive film and the source conductive film are metal films, for example. A layer formed by using a gate conductive film and including the gate electrode 3G may be referred to as a "gate metal layer", and a layer formed by using a source conductive film and including the source electrode 7S as a "source metal layer".

The source metal layer 7 includes the source electrode 7S and the drain electrode 7D of the TFT 10, the source bus line SL, and the patch electrode 15. The source electrode 7S and the drain electrode 7D are formed so as to be connected to the upper surface of the semiconductor layer 5. That is, the TFT 10 has a top contact structure. Herein, the source electrode 7S and the drain electrode 7D are connected to the upper surface of the semiconductor layer 5 respectively via the source contact layer 6S and the drain contact layer 6D.

The gate insulating layer 4 is formed between the semiconductor layer 5 and the gate metal layer 3. The gate insulating layer 4 has an opening 4a that reaches the patch electrode 15.

The gate metal layer 3 includes the gate electrode 3G of the TFT 10, the gate bus line GL, and a connecting portion 3a that is connected to the patch electrode 15 in the opening 4a. It is preferred that the connecting portion 3a is formed so as to cover a portion of the patch electrode 15 that is exposed through the opening 4a.

The gate metal layer 3 includes a first conductive layer L1 and a second conductive layer L2 formed on the first conductive layer L1 and including a transparent conductive layer (e.g., ITO), wherein the first conductive layer L1 is formed of a single layer or two or more layers selected from the group consisting of a MoNbNi layer, a MoNb layer, a MoW layer, a W layer, a Ta layer and a Ti layer, for example. The gate electrode 3G, the gate bus line GL and the connecting portion 3a each include the first conductive layer L1 and the second conductive layer L2. Since the first conductive layer L1 and the second conductive layer L2 are formed by using the same etching mask, the side surface of the first conductive layer L1 and the side surface of the second conductive layer L2 of the gate metal layer 3 are aligned with each other, as will be described later. For example, for each of the gate electrode 3G, the gate bus line GL and the connecting portion 3a, the side surface of the first conductive layer L1 and the side surface of the second conductive layer L2 are aligned with each other. Note that the first conductive layer L1 and the second conductive layer L2 may not be shown for the sake of simplicity.

The first conductive layer L1 of the gate metal layer 3 is formed of a high melting point metal containing layer. The "high melting point metal containing layer" is a layer including at least one element selected from the group consisting of titanium (Ti), tungsten (W), molybdenum (Mo), tantalum (Ta) and niobium (Nb). The high melting point metal containing layer may have a layered structure. For example, the high melting point metal containing layer refers to a layer that is formed of any of Ti, W, Mo, Ta, Nb, an alloy thereof, a nitride of such a metal or alloy, and a solid solution of such a metal or alloy and such a nitride.

The thickness of the first conductive layer L1 of the gate metal layer 3 is 20 nm or more and 500 nm or less, for example. The thickness of the second conductive layer L2 of the gate metal layer 3 is 30 nm or more and 200 nm or less, for example.

The structure of the gate metal layer 3 is not limited to the example described above. Note however that the gate metal layer 3 does not preferably include a metal that easily elutes into the liquid crystal layer LC (e.g., Cu, Al, Ag or Au). It is particularly preferred that the gate metal layer 3 does not include Cu.

In the TFT substrate 101, the patch electrode 15 is formed of the same conductive film as the source electrode 7S (i.e., the patch electrode 15 is included in the source metal layer 7), and it is therefore possible to reduce the manufacturing cost (e.g., the number of photomasks). With the TFT substrate 101, it is possible to reduce the cost of a scanned antenna.

In the process of manufacturing the TFT substrate of the scanned antenna of Patent Document No. 6, seven photomasks are used (excluding the formation of alignment marks 21), for example. In contrast, the TFT substrate 101 of the present embodiment can be manufactured using four photomasks. The detailed manufacturing process will be described later.

With the scanned antenna having the TFT substrate 101, it is possible to suppress the lowering of the antenna performance. This will be described below.

Figure 6:
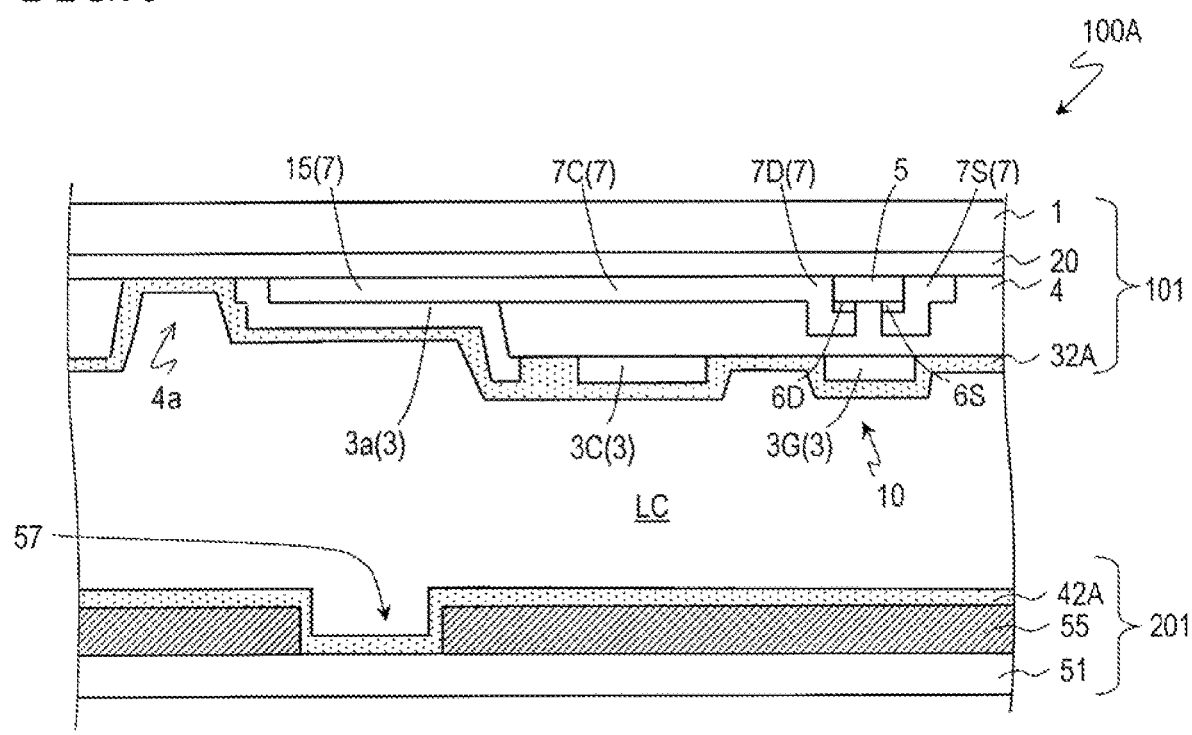
FIG. 6 is a cross-sectional view showing a structure of a liquid crystal display panel 100A included in the scanned antenna 1000.

FIG. 6 is a cross-sectional view showing the structure of the liquid crystal display panel 100A of the scanned antenna 1000. The liquid crystal display panel 100A includes the TFT substrate 101, the slot substrate 201, and the liquid crystal layer LC provided therebetween. As shown in FIG. 6, the TFT substrate 101 includes a first alignment film 32A that covers the surface of the TFT substrate 101 on the liquid crystal layer LC side. The first alignment film 32A is in contact with the gate metal layer 3 and the liquid crystal layer LC. The first alignment film 32A is formed so as to cover the gate metal layer 3. The slot substrate 201 arranged so as to oppose the TFT substrate 101 includes a second alignment film 42A that covers the slot electrode 55 and is in contact with the liquid crystal layer LC.

For example, if the gate metal layer 3 in contact with the first alignment film 32A includes a Cu layer, Cu from the gate metal layer 3 may elute into the liquid crystal layer LC. According to a study by the present inventor, it was not possible in some cases to sufficiently prevent Cu from eluting into the liquid crystal layer LC only by covering a gate metal layer including a Cu layer with an alignment film. With the elution of Cu into the liquid crystal layer LC, the liquid crystal material deteriorated, thereby lowering the antenna property in some cases.

As described above, a scanned antenna controls voltages to be applied to liquid crystal layers of antenna elements so as to vary the effective dielectric constant $M(\varepsilon_M)$ of the liquid crystal layers of the antenna elements, thereby forming a two-dimensional pattern with antenna elements of different capacitances. A liquid crystal material with a high dielectric anisotropy $\Delta\varepsilon_M$ in the microwave range (birefringence $\Delta n$ for visible light) has a low specific resistance, and therefore has a low holding ratio for the voltage applied to the liquid crystal capacitor. If the voltage holding ratio of the liquid crystal capacitor lowers, the effective voltage applied to the liquid crystal layer lowers, thereby failing to apply an intended voltage to the liquid crystal layer. As a result, the phase difference to be given to microwaves by the liquid crystal layers of the antenna elements will be shifted from the predetermined value. If the phase difference is shifted from the predetermined value, the antenna property lowers. In practice, a scanned antenna is designed so that the gain thereof is at maximum for a predetermined resonance frequency, and a decrease in voltage holding ratio manifests as a decrease in gain.

A liquid crystal material with a high dielectric anisotropy $\Delta\varepsilon_M$ in the microwave range includes an isothiocyanate group (—NCS) or a thiocyanate group (—SCN), for example. A liquid crystal material including an isothiocyanate group or a thiocyanate group deteriorates easily. When a liquid crystal material deteriorates, the specific resistance further decreases, thereby further decreasing the voltage holding ratio. A liquid crystal material including an isothiocyanate group or a thiocyanate group has a strong polarity, and the chemical stability thereof is lower than those of liquid crystal materials that are currently used in LCDs. An isothiocyanate group and a thiocyanate group have a strong polarity, and therefore easily absorb moisture, and may react with a metal ion (e.g., Cu ion or Al ion). Moreover, under continuous application of a DC voltage, it may be electrically decomposed. Moreover, a liquid crystal material including an isothiocyanate group or a thiocyanate group easily absorbs light from ultraviolet region to the vicinity of 430 nm and is subject to photodecomposition. Moreover, a liquid crystal material including an isothiocyanate group or a thiocyanate group is relatively weak against heat. For these reasons, the specific resistance of the liquid crystal material lowers and/or the ionic impurity thereof increases, thereby lowering the voltage holding ratio of the liquid crystal capacitor.

The gate metal layer 3 of the TFT substrate 101 has a layered structure including the first conductive layer L1 formed of a high melting point metal containing layer and the second conductive layer L2 including a transparent conductive layer. This suppresses the lowering of the antenna performance.

In view of the antenna performance, the source metal layer 7 including the patch electrode 15 preferably includes a low resistance metal layer. Herein, the "low resistance metal layer" is a layer including at least one element selected from the group consisting of copper (Cu), aluminum (Al), silver (Ag) and gold (Au). Note that the opening 4a and the connecting portion 3a may be omitted. Note however that the patch electrode 15 is preferably covered by at least one of the connecting portion 3a and the gate insulating layer 4. When the patch electrode 15 is covered by at least one of the connecting portion 3a and the gate insulating layer 4, it is possible to suppress the corrosion of the patch electrode 15. When the patch electrode 15 is covered by at least one of the connecting portion 3a and the gate insulating layer 4, it is possible to suppress the elution of a metal (particularly, Cu) from the patch electrode 15 into the liquid crystal layer LC.

In the illustrated example, the patch electrode 15 is covered by the connecting portion 3a and not covered by an insulating layer (excluding the alignment film). Therefore, it is possible to realize a high antenna performance.

The thickness of the source metal layer 7 is preferably 0.3 µm or more and 1 µm or less. Depending on the TFT configuration, with the source metal layer whose thickness is over 1 µm, for example, it may not be possible to realize an intended patterning precision. For example, there may arise a problem that it is not possible to precisely control the length of the gap between the source electrode and the drain electrode (which corresponds to the channel length of the TFT). Therefore, the thickness of the source metal layer 7 is preferably 1 µm or less.

The source metal layer 7 may be formed only from a low resistance metal layer, or may have a layered structure including a low resistance metal layer. The layered structure including a low resistance metal layer has a high melting point metal containing layer on and/or under the low resistance metal layer. The thickness of the low resistance metal layer of the source metal layer 7 may be 0.3 µm or more and 0.9 µm or less, for example. When the source electrode 7S, the drain electrode 7D and the patch electrode 15 include an Al layer (i.e., when the source metal layer 7 includes an Al layer), the thickness of the Al layer is preferably 0.3 µm or more and 0.9 µm or less. When the source electrode 7S, the drain electrode 7D and the patch electrode 15 include a Cu layer (i.e., when the source metal layer 7 includes a Cu layer), the thickness of the Cu layer is preferably 0.3 µm or more and 0.8 µm or less.

As shown in the figure, the TFT substrate 101 may further include a base insulating layer 20 between the dielectric substrate 1 and the semiconductor layer 5. The base insulating layer 20 is formed across the entire surface of the dielectric substrate 1, for example. Note that the base insulating layer 20 may be omitted.

Each antenna element region may include a storage capacitor that is connected electrically in parallel to a liquid crystal capacitor. In this example, the storage capacitor is formed by a lower storage capacitor electrode 7C that is electrically connected to the drain electrode 7D, the gate insulating layer 4, and an upper storage capacitor electrode 3C that opposes the lower storage capacitor electrode 7C with the gate insulating layer 4 therebetween. The lower storage capacitor electrode 7C is included in the source metal layer 7, and the upper storage capacitor electrode 3C is included in the gate metal layer 3. The gate metal layer 3 further includes a CS bus line (storage capacitor line) CL connected to the upper storage capacitor electrode 3C. The CS bus line CL extends generally parallel to the gate bus line GL, for example. In this example, the upper storage capacitor electrode 3C is formed integral with the CS bus line CL. The width of the upper storage capacitor electrode 3C may be larger than the width of the CS bus line CL. In this example, the lower storage capacitor electrode 7C is extended from the drain electrode 7D. The width of the lower storage capacitor electrode 7C may be larger than the width of a portion of the extension from the drain electrode 7D excluding the lower storage capacitor electrode 7C. In this example, the patch electrode 15 is extended from the lower storage capacitor electrode 7C that is extended from the drain electrode 7D. Note that the positional relationship between the storage capacitor and the patch electrode 15 is not limited to the illustrated example.

Gate-source connecting portion SG

The TFT substrate 101 includes gate-source connecting portions SG in the non-transmitting/receiving region R2. The gate-source connecting portions SG electrically connect the gate bus lines GL to connection lines (referred to also as "gate lower connection lines") formed in the source metal layer 7. With the provision of the gate-source connecting portion SG, the lower connection portion of the gate terminal portion GT can be formed in the source metal layer 7. The gate terminal portion GT having a lower connection portion formed in the source metal layer 7 has a high reliability. The details will be described later.

As shown in portion (b) of FIG. 3, FIG. 4(b), FIG. 5(b) and FIG. 5(c), the gate-source connecting portion SG electrically connects together the gate bus line GL and a gate lower connection line 7sg with a gate bus line connecting portion 3sgA therebetween.

Specifically, the gate-source connecting portion SG includes the gate lower connection line 7sg, an opening 4sg1 formed in the gate insulating layer 4, and the gate bus line connecting portion 3sgA connected to the gate bus line GL.

The gate lower connection line 7sg is included in the source metal layer 7 and is electrically separated from the source bus line SL.

The opening 4sg1 formed in the gate insulating layer 4 reaches the gate lower connection line 7sg.

The gate bus line connecting portion 3agA is included in the gate metal layer 3 and is electrically connected to the gate bus line GL. In this example, the gate bus line connecting portion 3agA is extended from the gate bus line GL and is formed integral with the gate bus line GL. The gate bus line connecting portion 3sgA is formed in the opening 4sg1 formed in the gate insulating layer 4, and is connected to the gate lower connection line 7sg in the opening 4sg1. In this example, the gate bus line connecting portion 3sgA is in contact with the gate lower connection line 7sg in the opening 4sg1.

The gate bus line connecting portion 3sgA is included in the gate metal layer 3 as are the upper connection portions of the terminal portions to be described later. Thus, the TFT substrate 101 can be manufactured by using four photomasks.

For example, the gate bus line connecting portion 3sgA includes the first conductive layer L1 and the second conductive layer L2 included in the gate metal layer 3. The side surface of the first conductive layer L1 of the gate bus line connecting portion 3sgA and the side surface of the second conductive layer L2 of the gate bus line connecting portion 3gA are aligned with each other.

The width of the gate bus line connecting portion 3sgA may be larger than the width of the gate bus line GL. Herein, the width of the gate bus line connecting portion 3sgA is smaller than the width of the gate lower connection line 7sg.

Gate terminal portion GT

The TFT substrate 101 includes gate terminal portions GT in the non-transmitting/receiving region R2. The gate terminal portions GT are typically provided corresponding to the gate-source connecting portions SG, which are provided corresponding to the gate bus lines.

As shown in portion (b) of FIG. 3 and FIG. 4(c), the gate terminal portion GT includes a gate terminal lower connection portion 7gA (referred to also simply as "lower connection portion 7gA"), an opening 4g formed in the gate insulating layer 4, and a gate terminal upper connection portion 3gA (referred to also simply as "upper connection portion 3gA").

The lower connection portion 7gA is included in the source metal layer 7. The lower connection portion 7gA is connected to the gate lower connection line 7sg formed in the gate-source connecting portion SG. In this example, the lower connection portion 7gA is extended from the gate lower connection line 7sg and is formed integral with the gate lower connection line 7sg.

The opening 4g formed in the gate insulating layer 4 reaches the lower connection portion 7gA.

The upper connection portion 3gA is included in the gate metal layer 3. The upper connection portion 3gA is formed in the opening 4g formed in the gate insulating layer 4, and is connected to the lower connection portion 7gA in the opening 4g. Herein, the upper connection portion 3gA is in contact with the lower connection portion 7gA in the opening 4g.

With the upper connection portion 3gA included in the gate metal layer 3, the TFT substrate 101 can be manufactured by using four photomasks.

The upper connection portion 3gA includes the first conductive layer L1 and the second conductive layer L2 included in the gate metal layer 3, for example. The side surface of the first conductive layer L1 of the upper connection portion 3gA and the side surface of the second conductive layer L2 of the upper connection portion 3gA are aligned with each other.

As seen from the direction normal to the dielectric substrate 1, the entire upper connection portions 3gA may overlap with the lower connection portions 7gA.

Since the gate terminal portion GT includes the lower connection portion 7gA included in the source metal layer 7, the reliability is high as compared with a case in which the lower connection portion is included in the gate metal layer 3, for example.

Terminal portions, particularly those that are provided on the outer side of the seal region Rs (the opposite side from the liquid crystal layer), may corrode due to moisture (which may include impurities) in the air. In the step of producing a TFT substrate having a glass substrate as the dielectric substrate, scratches and disconnections may occur on the lower connection portion of the terminal portion due to broken pieces and cullet from the glass substrate. For example, a plurality of TFT substrates are produced from a single mother substrate. Cullet may be produced for example when severing the mother substrate and when forming a scribe line on the mother substrate.

When the lower connection portion is included in the gate metal layer 3, since no insulating layer is formed on the lower connection portion, the lower connection portion is likely to have the problems described above (i.e., corrosion, scratches, disconnections, etc.). In contrast, with the gate terminal portion GT of the TFT substrate 101, since the lower connection portion 7gA is included in the source metal layer 7, the problems described above are suppressed. Thus, with the gate terminal portion GT of the TFT substrate 101, since the lower connection portion 7gA is included in the source metal layer 7, the reliability is high as compared with a case in which the lower connection portion is included in the gate metal layer 3, for example. In view of the reliability, the thickness of the gate insulating layer 4 is preferably large.

Source terminal portion ST

As shown in portion (c) of FIG. 3 and FIG. 4(d), the source terminal portions ST may have a similar configuration to the gate terminal portions GT. The source terminal portions ST are typically provided corresponding to the source bus lines.

The source terminal portion ST includes a source terminal lower connection portion 7sA (referred to also simply as "lower connection portion 7sA"), an opening 4s formed in the gate insulating layer 4, and a source terminal upper connection portion 3sA (referred to also simply as "upper connection portion 3aA").

The lower connection portion 7sA is included in the source metal layer 7 and is connected to the source bus line SL. In this example, the lower connection portion 7sA is extended from the source bus line SL and is formed integral with the source bus line SL.

The opening 4s formed in the gate insulating layer 4 reaches the lower connection portion 7sA.

The upper connection portion 3sA is included in the gate metal layer 3. The upper connection portion 3sA is formed in the opening 4s formed in the gate insulating layer 4, and is connected to the lower connection portion 7sA in the opening 48. Herein, the upper connection portion 3sA is in contact with the lower connection portion 7aA in the opening 4s.

With the upper connection portion 3sA included in the gate metal layer 3, the TFT substrate 101 can be manufactured by using four photomasks. The upper connection portions of other terminal portions to be described below are also similarly included in the gate metal layer 3. Thus, the TFT substrate 101 can be manufactured by using four photomasks.

The upper connection portion 3sA includes the first conductive layer L1 and the second conductive layer L2 included in the gate metal layer 3, for example. The side surface of the first conductive layer L1 of the upper connection portion 3sA and the side surface of the second conductive layer L2 of the upper connection portion 3sA are aligned with each other.

As seen from the direction normal to the dielectric substrate 1, the entire upper connection portions 3sA may overlap with the lower connection portions 7sA.

Since the source terminal portion ST includes the lower connection portion 7sA included in the source metal layer 7, the source terminal portion ST has a high reliability as does the gate terminal portion GT. As described above, to form the lower connection portion of the gate terminal portion GT in the source metal layer 7, the gate-source connecting portion SG for connecting together the gate metal layer 3 and the source metal layer 7 is provided for each gate terminal portion GT. In contrast, with the source terminal portion ST, there is no need to provide such connection portions.

CS terminal portion CT, CS-source connecting portion SC

As shown in portion (b) of FIG. 3, the TFT substrate 101 includes the CS terminal portion CT and the CS-source connecting portion SC in the non-transmitting/receiving region R2. The CS-source connecting portions SC are provided corresponding to the CS bus lines, for example. The CS terminal portions CT are provided corresponding to the CS-source connecting portions SC, which are provided corresponding to the CS bus lines, for example. The CS terminal portion CT, whose cross-sectional structure is not shown, may have a similar configuration to the gate terminal portion GT as shown in portion (b) of FIG. 3. The CS-source connecting portion SC, whose cross-sectional structure is also not shown, has a similar configuration to the gate-source connecting portion SG in this example.

Specifically, the CS-source connecting portion SC includes a CS lower connection line 7sc, an opening 4sc1 formed in the gate insulating layer 4, and a CS bus line connecting portion 3scA connected to the CS bus line CL.

The CS lower connection line 7sc is included in the source metal layer 7 and is electrically separated from the source bus line SL.

The opening 4sc1 formed in the gate insulating layer 4 reaches the CS lower connection line 7sc.

The CS bus line connecting portion 3scA is included in the gate metal layer 3 and is electrically connected to the CS bus line CL. In this example, the CS bus line connecting portion 3scA is extended from the CS bus line CL and is formed integral with the CS bus line CL. The CS bus line connecting portion 3scA is formed in the opening 4sc1 formed in the gate insulating layer 4, and is connected to the CS lower connection line 7ac in the opening 4sc1. In this example, the CS bus line connecting portion 3scA is connected to the CS lower connection line 7sc in the opening 4sc1.

The CS bus line connecting portion 3scA includes the first conductive layer L1 and the second conductive layer L2 included in the gate metal layer 3. The side surface of the first conductive layer L1 of the CS bus line connecting portion 3scA and the side surface of the second conductive layer L2 of the CS bus line connecting portion 3scA are aligned with each other.

The width of the CS bus line connecting portion 3acA may be larger than the width of the CS bus line CL. Herein, the width of the CS bus line connecting portion 3scA is smaller than the width of the CS lower connection line 7sc.

With the provision of the CS-source connecting portion SC, the lower connection portion of the CS terminal portion CT can be formed in the source metal layer 7. Thus, the CS terminal portion CT of the TFT substrate 101 has a high reliability.

The CS terminal portion CT includes a CS terminal lower connection portion 7c (referred to also simply as "lower connection portion 7c"), an opening 4c formed in the gate insulating layer 4, and a CS terminal upper connection portion 3c (referred to also simply as "upper connection portion 3c").

The lower connection portion 7c is included in the source metal layer 7. The lower connection portion 7c is connected to the CS lower connection line 7sc formed in the CS-source connecting portion SC. In this example, the lower connection portion 7c is extended from the CS lower connection line 7sc. In this example, the portion extended from the CS lower connection line 7sc includes a lower connection portion 7p1A of the first transfer terminal portion PT1, a lower connection portion 7p2 of the second transfer terminal portion PT2 which are described below, and the CS terminal lower connection portion 7c.

The opening 4c formed in the gate insulating layer 4 reaches the lower connection portion 7c.

The upper connection portion 3c is included in the gate metal layer 3. The upper connection portion 3c is formed in the opening 4c formed in the gate insulating layer 4, and is connected to the lower connection portion 7c in the opening 4c. Herein, the upper connection portion 3c is in contact with the lower connection portion 7c in the opening 4c.

The upper connection portion 3c includes the first conductive layer L1 and the second conductive layer L2 included in the gate metal layer 3, for example. The side surface of the first conductive layer L1 of the upper connection portion 3c and the side surface of the second conductive layer L2 of the upper connection portion 3c are aligned with each other.

As seen from the direction normal to the dielectric substrate 1, the entire upper connection portions 3c may overlap with the lower connection portions 7c.

Since the CS terminal portion CT includes the lower connection portion 7c included in the source metal layer 7, the CS terminal portion CT has a high reliability as does the gate terminal portion GT.

In the illustrated example, the gate-source connecting portion SG and the CS-source connecting portion SC are provided on the inner side of the seal region Rs (on the liquid crystal layer side). The present embodiment is not limited to this, and the gate-source connecting portion SG and/or the CS-source connecting portion SC may be provided on the outer side of the seal region Rs (the opposite side from the liquid crystal layer).

Transfer terminal portion PT

As shown in portion (b) of FIG. 3 and FIG. 5(a), the first transfer terminal portion PT1 includes a first transfer terminal lower connection portion 7p1A (referred to also simply as "lower connection portion 7p1A"), an opening 4p1A formed in the gate insulating layer 4, and a first transfer terminal upper connection portion 3p1A (referred to also simply as "upper connection portion 3p1A").

The lower connection portion 7p1A is included in the source metal layer 7. The lower connection portion 7p1A is electrically separated from the source bus line SL. The lower connection portion 7p1A is electrically connected to the CS bus line CL. In this example, the lower connection portion 7p1A is formed integral with the CS lower connection line 7sc formed in the CS-source connecting portion SC.

The opening 4p1A formed in the gate insulating layer 4 reaches the lower connection portion 7p1A.

The upper connection portion 3p1A is included in the gate metal layer 3. The upper connection portion 3p1A is formed in the opening 4p1A formed in the gate insulating layer 4, and is connected to the lower connection portion 7p1A in the opening 4p1A. Herein, the upper connection portion 3p1A is in contact with the lower connection portion 7p1A in the opening 4p1A. For example, the upper connection portion 3p1A is connected to the transfer terminal connection portion on the slot substrate side via a sealant including conductive particles (see FIG. 7(b) to be discussed later).

The upper connection portion 3p1A includes the first conductive layer L1 and the second conductive layer L2 included in the gate metal layer 3, for example. The side surface of the first conductive layer L1 of the upper connection portion 3p1A and the side surface of the second conductive layer L2 of the upper connection portion 3p1A are aligned with each other.

Since the first transfer terminal portion PT1 includes the lower connection portion 7p1A included in the source metal layer 7, the first transfer terminal portion PT1 has a high reliability as does the gate terminal portion GT.

In this example, the opening 4p1A formed in the gate insulating layer 4 is formed so as to expose only a portion of the lower connection portion 7p1A. As seen from the direction normal to the dielectric substrate 1, the opening 4p1A formed in the gate insulating layer 4 is located on the inner side of the lower connection portion 7p1A. Therefore, the entire region inside the opening 4p1A has a layered structure including the lower connection portion 7p1A and the upper connection portion 3p1A on the dielectric substrate 1. In the first transfer terminal portion PT1, the entire region that does not include the lower connection portion 7p1A has a layered structure including the gate insulating layer 4. Thus, the first transfer terminal portion PT1 of the TFT substrate 101 has a high reliability. In view of the reliability, the thickness of the gate insulating layer 4 is preferably large.

A portion of the lower connection portion 7p1A that is inside the opening 4p1A is covered by the upper connection portion 3p1A.

As seen from the direction normal to the dielectric substrate 1, the entire upper connection portions 3p1A may overlap with the lower connection portions 7p1A.

In this example, the lower connection portion 7p1A is arranged between two gate bus lines GL adjacent to each other. Two lower connection portions 7p1A arranged with the gate bus line GL interposed therebetween may be electrically connected to each other via a conductive connection portion (not shown). The conductive connection portion may be formed in the gate metal layer 3.

Note that while the lower connection portion 7p1A is connected to the upper connection portion 3p1A through one opening 4p1A herein, a plurality of openings may be provided for each lower connection portion 7p1A.

The second transfer terminal portion PT2 is provided on the outer side of the seal region Rs (the opposite side from the transmitting/receiving region R1). As shown in FIG. 4(e), the second transfer terminal portion PT2 includes a second transfer terminal lower connection portion 7p2 (referred to also simply as "lower connection portion 7p2"), an opening 4p2 formed in the gate insulating layer 4, and a second transfer terminal upper connection portion 3p2 (referred to also simply as "upper connection portion 3p2").

The lower connection portion 7p2 is included in the source metal layer 7. The lower connection portion 7p2 is electrically separated from the source bus line SL. The lower connection portion 7p2 is electrically connected to the CS bus line CL. In this example, the lower connection portion 7p2 is extended from the first transfer terminal lower connection portion 7p1A extended from the CS lower connection line 7sc formed in the CS-source connecting portion SC, and is formed integral with the lower connection portion 7p1A.

The opening 4p2 formed in the gate insulating layer 4 reaches the lower connection portion 7p2.

The upper connection portion 3p2 is included in the gate metal layer 3. The upper connection portion 3p2 is formed in the opening 4p2 formed in the gate insulating layer 4, and is connected to the lower connection portion 7p2 in the opening 4p2. Herein, the upper connection portion 3p2 is in contact with the lower connection portion 7p2 in the opening 4p2.

The upper connection portion 3p2 includes the first conductive layer L1 and the second conductive layer L2 included in the gate metal layer 3, for example. The side surface of the first conductive layer L1 of the upper connection portion 3p2 and the side surface of the second conductive layer L2 of the upper connection portion 3p2 are aligned with each other.

Since the second transfer terminal portion PT2 includes the lower connection portion 7p2 included in the source metal layer 7, the second transfer terminal portion PT2 has a high reliability as does the gate terminal portion GT.

Also with the second transfer terminal portion PT2, the upper connection portion 3p2 may be connected to the transfer terminal connection portion on the slot substrate side by a sealant containing conductive particles therein, for example.

<Structure of Slot Substrate 201>

Figure 7A:
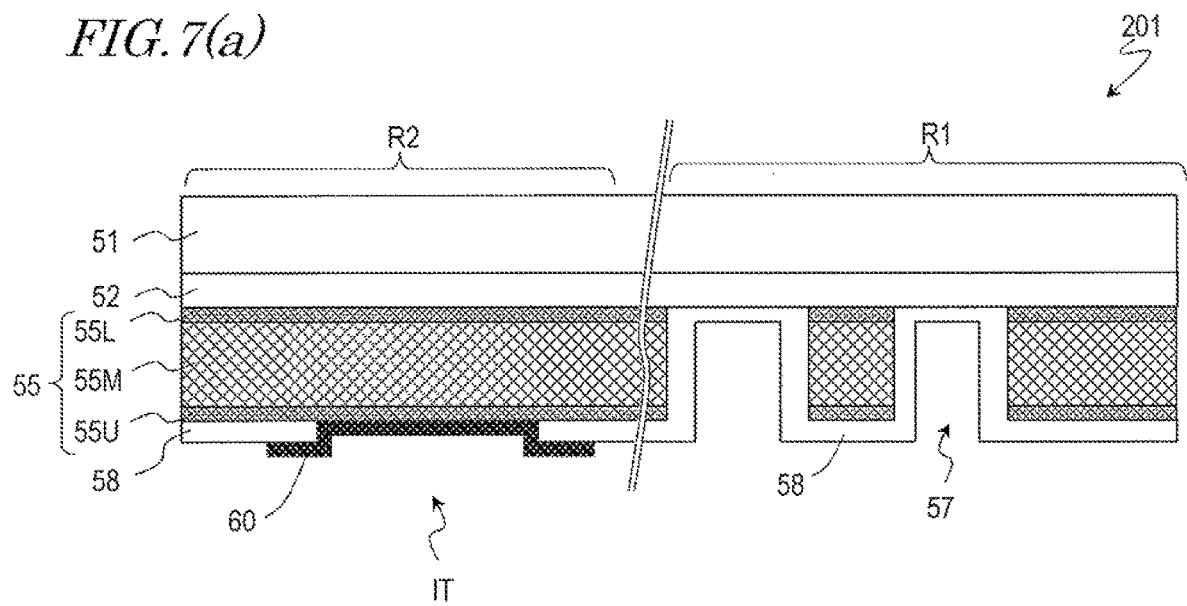
FIG. 7(a) is a cross-sectional view schematically showing the slot substrate 201.
Figure 7B:
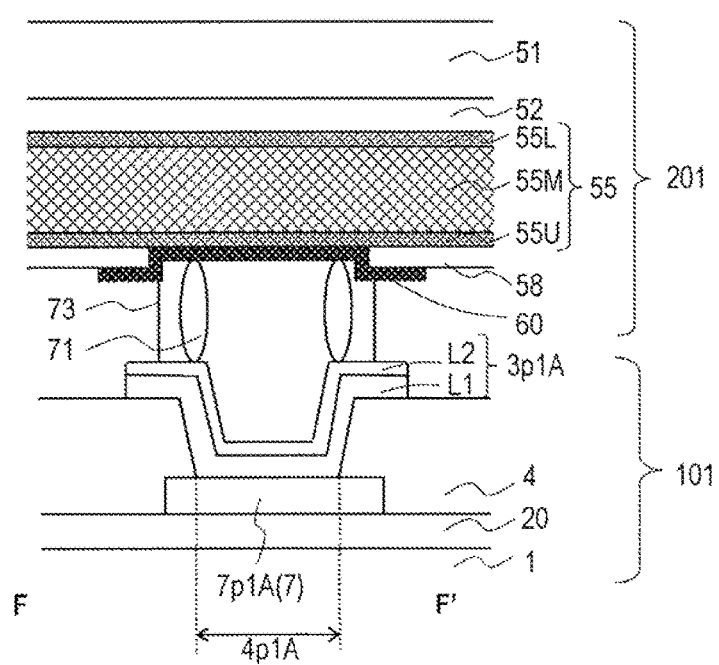
FIG. 7(b) is a schematic cross-sectional view illustrating a transfer portion that connects together a first transfer terminal portion PT1 of the TFT substrate 101 and a terminal portion IT of the slot substrate 201.

Referring to FIG. 7(a) and FIG. 7(b), the structure of the slot substrate 201 will be described in greater detail.

FIG. 7(a) is a cross-sectional view schematically showing the antenna element region U and the terminal portion IT of the slot substrate 201.

The slot substrate 201 includes the dielectric substrate 51 having a front surface and a reverse surface, a third insulating layer 52 formed on the front surface of the dielectric substrate 51, the slot electrode 55 formed on the third insulating layer 52, and a fourth insulating layer 58 covering the slot electrode 55. The reflective conductive plate 65 is arranged so as to oppose the reverse surface of the dielectric substrate 51 with the dielectric layer (air layer) 54 interposed therebetween. The slot electrode 55 and the reflective conductive plate 65 each function as a wall of the waveguide 301.

In the transmitting/receiving region R1, a plurality of slots 57 are formed in the slot electrode 55. The slots 57 are openings running through the slot electrode 55. In this example, one slot 57 is arranged in each antenna element region U.

The fourth insulating layer 58 is formed on the slot electrode 55 and in the slot 57. The material of the fourth insulating layer 58 may be the same material as the third insulating layer 52. By covering the slot electrode 55 with the fourth insulating layer 58, the slot electrode 55 and the liquid crystal layer LC are not in direct contact with each other, thus increasing the reliability. When the slot electrode 55 is formed from a Cu layer, Cu may elute into the liquid crystal layer LC. When the slot electrode 55 is formed from an Al layer using a thin film deposition technique, voids may be contained in the Al layer. The fourth insulating layer 58 is capable of preventing the liquid crystal material from entering the voids of the Al layer. Note that the problem of voids can be avoided if an aluminum foil, as the Al layer, is attached on the dielectric substrate 51 via an adhesive and is patterned to produce the slot electrode 55.

The slot electrode 55 includes a main layer 55M such as a Cu layer or an Al layer. The slot electrode 55 may have a layered structure including the main layer 55M, and an upper layer 55U and a lower layer 55L arranged so as to sandwich the main layer 55N therebetween. The thickness of the main layer 55M is set in view of the skin effect depending on the material, and it may be 2 μm or more and 30 μm or less, for example. The thickness of the main layer 55M is typically greater than the thickness of the upper layer 55U and the lower layer 55L.

In the illustrated example, the main layer 55M is a Cu layer, and the upper layer 55U and the lower layer 55L are each a Ti layer. By arranging the lower layer 55L between the main layer 55M and the third insulating layer 52, it is possible to improve the adhesion between the slot electrode 55 and the third insulating layer 52. By providing the upper layer 55U, it is possible to suppress the corrosion of the main layer 55M (e.g., a Cu layer).

Since the reflective conductive plate 65 forms a wall of the waveguide 301, it preferably has a thickness that is 3 times or more, preferably 5 times or more, the skin depth. The reflective conductive plate 65 may be an aluminum plate, a copper plate, or the like, that is produced by machining and has a thickness of some mm, for example.

The terminal portion IT is provided in the non-transmitting/receiving region R2. The terminal portion IT includes the slot electrode 55, the fourth insulating layer 58 covering the slot electrode 55, and an upper connecting portion 60. The fourth insulating layer 58 has an opening that reaches the slot electrode 55. In the opening, the upper connecting portion 60 is in contact with the slot electrode 55. In the present embodiment, the terminal portion IT is arranged in the seal region Rs, and is connected to the transfer terminal portion (transfer portion) of the TFT substrate via a seal resin containing conductive particles therein.

Transfer portion

FIG. 7(b) is a schematic cross-sectional view illustrating a transfer portion that connects together the first transfer terminal portion PT1 of the TFT substrate 101 and the terminal portion IT of the slot substrate 201.

In the transfer portion, the upper connecting portion 60 of the terminal portion IT is electrically connected to the first transfer terminal upper connection portion 3p1A of the first transfer terminal portion PT1 of the TFT substrate 101. In the present embodiment, the upper connecting portion 60 and the upper connection portion 3p1A are connected together via a resin (seal resin) 73 containing conductive beads 71 therein (referred to also as a "seal portion 73").

Each of the upper connecting portion 60 and the second conductive layer L2 of the upper connection portion 3p1A is a transparent conductive layer such as an ITO film or an IZO film, and an oxide film may be formed on the surface thereof. When an oxide film is formed, an electrical connection between the transparent conductive layers may possibly not be ensured, thereby increasing the contact resistance. In contrast, in the present embodiment, these transparent conductive layers are bonded via a resin containing the conductive beads (e.g., Au beads) 71 therein. Therefore, even if a surface oxide film is formed, the conductive beads can break through (penetrate through) the surface oxide film, thereby suppressing the increase in the contact resistance. The conductive beads 71 may penetrate not only through the surface oxide film but also the upper connection portion 60 and the second conductive layer L2 of the upper connection portion 3p1A, which are the transparent conductive layers, thereby being in direct contact with the slot electrode 55 and the first conductive layer L1 of the upper connection portion 3p1A.

The transfer portions may be arranged in either one or both of the center portion and the peripheral portion of the scanned antenna 1000 (i.e., on the inner side and the outer side of the donut-shaped transmitting/receiving region R1 as seen from the direction normal to the scanned antenna 1000). The transfer portions may be arranged in the seal region Rs for sealing the liquid crystal and may be arranged on the outer side of the seal region Rs (the opposite side from the liquid crystal layer).

<Method for Manufacturing TFT Substrate 101>

A method for manufacturing the TFT substrate 101 will be described with reference to FIGS. 8(a) to 8(e) and FIGS. 9(a) to 9(c).

FIGS. 8(a) to 8(e) and FIGS. 9(a) to 9(c) are schematic cross-sectional views illustrating a method for manufacturing the TFT substrate 101. These figures show cross sections corresponding to FIGS. 4(a) to 4(c) and FIG. 5(a). Note that while cross sections corresponding to FIG. 4(d), FIG. 4(e) and FIG. 5(b) are not shown, these portions are formed by a similar method to that shown in the cross section corresponding to FIG. 4(c).

As described above, in the present embodiment, the TFT substrate 101 includes the source metal layer 7, the gate insulating layer 4 and the gate metal layer 3 in this order on the dielectric substrate 1.

The source metal layer 7 includes the source electrode 7S and the drain electrode 7D of the TFT 10, the patch electrode 15, the source bus line SL, the lower storage capacitor electrode 7C, the lower connection portions 7gA, 7sA, 7c, 7p1A and 7p2 of the terminal portions, the gate lower connection line 7sg of the gate-source connecting portion SG, and the CS lower connection line 7ac of the CS-source connecting portion SC.

The gate metal layer 3 includes the gate electrode 3G of the TFT 10, the gate bus line GL, the CS bus line CL, the connecting portion 3a, the upper storage capacitor electrode 3C, the upper connection portions 3gA, 3sA, 3c, 3p1A and 3p2 of the terminal portions, the gate bus line connecting portion 3sgA of the gate-source connecting portion SG, and the CS bus line connecting portion 3acA of the CS-source connecting portion SC.

First, as shown in FIG. 8(a), the base insulating layer 20, an intrinsic amorphous silicon film 5' and an n$^+$-type amorphous silicon film 6' are formed in this order on the dielectric substrate 1. Herein, a silicon nitride ($Si_xN_y$) film having a thickness of 200 nm, for example, is formed as the base insulating layer 20. Moreover, the intrinsic amorphous silicon film 5' having a thickness of 120 nm, for example, and the n$^+$-type amorphous silicon film 6' having a thickness of 30 nm, for example, are formed. Note that the semiconductor film used for the semiconductor layer 5 is not limited to an amorphous silicon film.

Then, the intrinsic amorphous silicon film 5' and the n$^+$-type amorphous silicon film 6' are patterned so as to obtain an island-shaped semiconductor layer 5 and an island-shaped contact layer 6, as shown in FIG. 8(b).

Then, as shown in FIG. 8(c), a source conductive film 7' is formed on the base insulating layer 20 and the contact layer 6. Herein, a layered film (Cu/Ti) obtained by layering Ti (thickness: 20 nm, for example) and Cu (thickness: 500 nm, for example) in this order is formed as the source conductive film 7'.

Then, the source conductive film 7' is patterned to obtain the source metal layer 7 as shown in FIG. 8(d). Specifically, the source electrode 7S and the drain electrode 7D, the patch electrode 15 connected to the drain electrode 7D, the source bus line SL connected to the source electrode 7S, and the lower storage capacitor electrode 7C connected to the drain electrode 7D are formed in the antenna element formation region; the lower connection portions 7gA, 7sA, 7c, 7p1A and 7p2 are formed in the respective terminal portion formation regions; the gate lower connection line 7sg is formed in the gate-source connection portion formation region; and the CS lower connection line 7sc is formed in the CS-source connection portion formation region. In this process, the contact layer 6 is also etched, thereby forming the source contact layer 6S and the drain contact layer 6D that are separated from each other. Herein, the patterning of the source conductive film 7' is performed by wet etching and dry etching. For example, after patterning the Cu film by wet etching using a mixed acid aqueous solution, the Ti film and the contact layer (n$^+$-type amorphous silicon layer) 6 may be patterned simultaneously by dry etching.

Next, as shown in FIG. 8(e), a gate insulating film 4' is formed so as to cover the source metal layer 7 and the base insulating layer 20. The gate insulating film 4' may be a silicon oxide ($SiO_x$) film, a silicon nitride ($Si_xN_y$) film, a silicon oxide nitride ($SiO_xN_y$; x>y) film, a silicon nitride oxide ($SiN_xO_y$; x>y) film, or the like. Herein, a silicon nitride ($Si_xN_y$) film having a thickness of 350 nm, for example, is formed as the gate insulating film 4'. In this example, the gate insulating film 4' is arranged so as to be in contact with the channel region of the semiconductor layer 5.

Note that although the gate insulating film 4' or the gate insulating layer 4 may be represented as if it were a flattening layer in these cross-sectional views for the sake of simplicity, a layer that is formed by a thin film deposition method (e.g., a CVD method, a sputtering method, and a vacuum deposition method) typically has a surface that reflects steps of the underlying layer.

Then, the gate insulating film 4' is etched by a photolithography process known in the art, thereby obtaining the gate insulating layer 4, as shown in FIG. 9(a). Specifically, the opening 4a reaching the patch electrode 15 is formed in the antenna element formation region; the opening 4g reaching the lower connection portion 7gA is formed in the gate terminal portion formation region; the opening 4s reaching the lower connection portion 7sA is formed in the source terminal portion formation region; the opening 4c reaching the lower connection portion 7c is formed in the CS terminal portion formation region; the opening 4p1A reaching the lower connection portion 7p1A is formed in the first transfer terminal portion formation region; the opening 4p2 reaching the lower connection portion 7p2 is formed in the second transfer terminal portion formation region; the opening 4sg1 reaching the gate lower connection line 7sg is formed in the gate-source connection portion formation region; and the opening 4sc1 reaching the CS lower connection line 7sc is formed in the CS-source connection portion formation region. The gate insulating film 4' is etched by dry etching using a fluorine-based gas, for example.

Then, as shown in FIG. 9(b), a gate conductive film 3' is formed on the gate insulating layer 4 and in the openings formed in the gate insulating layer 4. Herein, the gate conductive film 3' is a layered film obtained by layering a first conductive film L1' and a second conductive film L2' in this order. For example, first, a MoNbNi film (thickness: 300 nm, for example) is formed as the first conductive film on the gate insulating layer 4 and in the openings formed in the gate insulating layer 4, and then an ITO film (thickness: 70 nm, for example) is formed as the second conductive film L2' on the first conductive film L1', thereby obtaining the gate conductive film 3' (herein, a layered film of ITO/MoNbNi). The first conductive film L1' may be one film or a layered film of two or more films selected from the group consisting of a MoNbNi film, a MoNb film, a MoW film, a W film, a Ta film and a Ti film.

Then, the gate conductive film 3' is patterned, thereby obtaining the gate metal layer 3 as shown in FIG. 9(c). Herein, the patterning of the gate conductive film 3' is done by wet etching, for example. Herein, the first conductive film L1' and the second conductive film L2' are etched by using the same etching mask. Thus, the gate metal layer 3 including the first conductive layer L1 and the second conductive layer L2 is obtained. The side surface of the first conductive layer L1 of the obtained gate metal layer 3 and the side surface of the second conductive layer L2 thereof are aligned with each other.

Specifically, the gate electrode 3G including a portion that opposes the semiconductor layer 5 with the gate insulating layer 4 therebetween, the gate bus line GL connected to the gate electrode 3G, the upper storage capacitor electrode 3C including a portion that opposes the lower storage capacitor electrode 7C with the gate insulating layer 4 therebetween, the CS bus line CL connected to the upper storage capacitor electrode 3C, and the connecting portion 3a connected to the patch electrode 15 in the opening 4a are formed in the antenna element formation region. The upper connection portion 3gA connected to the lower connection portion 7gA in the opening 4g is formed in the gate terminal portion formation region; the upper connection portion 3sA connected to the lower connection portion 7sA in the opening 4s is formed in the source terminal portion formation region; the upper connection portion 3c connected to the lower connection portion 7c in the opening 4c is formed in the CS terminal portion formation region; the upper connection portion 3p1A connected to the lower connection portion 7p1A in the opening 4p1A is formed in the first transfer terminal portion formation region; the upper connection portion 3p2 connected to the lower connection portion 7p2 in the opening 4p2 is formed in the second transfer terminal portion formation region; the gate bus line connecting portion 3sgA connected to the gate lower connection line 7sg in the opening 4sg1 is formed in the gate-source connection portion formation region; and the CS bus line connecting portion 3scA connected to the CS lower connection line 7sc in the opening 4sc1 is formed in the CS-source connection portion formation region.

Thus, the TFT 10 is obtained, and the antenna element region U, the source terminal portion ST, the gate terminal portion GT, the CS terminal portion CT, the first transfer terminal portion PT1, the second transfer terminal portion PT2, the gate-source connecting portion SG and the CS-source connecting portion SC are obtained.

The TFT substrate 101 is manufactured as described above.

As stated above, the TFT substrate 101 can be manufactured by using four photomasks.

<Method for Manufacturing Slot Substrate 201>

The slot substrate 201 can be manufactured by the following method, for example.

First, a third insulating layer (thickness: 200 nm, for example) 52 is formed on a dielectric substrate. The dielectric substrate may be a substrate having a high transmittance for electromagnetic waves (having a small dielectric constant $\varepsilon_M$ and a small dielectric loss $\tan\delta_M$), such as a glass substrate or a resin substrate. The dielectric substrate is preferably thin in order to suppress the attenuation of electromagnetic waves. For example, the glass substrate can be thinned from the reverse side after the formation of elements such as the slot electrode 55 on the surface of the glass substrate in the process to be described later. Thus, the thickness of the glass substrate can be reduced to 500 μm or less, for example.

When a resin substrate is used as the dielectric substrate, elements such as TFTs may be formed directly on the resin substrate or may be formed on the resin substrate using a transfer method. With a transfer method, for example, after a resin film (e.g., a polyimide film) is formed on a glass substrate and elements are formed on the resin film by a process to be described later, the resin film on which the elements have been formed is separated from the glass substrate. Typically, a resin has a smaller dielectric constant CM and a smaller dielectric loss $\tan\delta_M$ than a glass. The thickness of the resin substrate is 3 μm to 300 μm, for example. As the resin material, a liquid crystal polymer may be used, for example, as well as a polyimide.

There is no particular limitation on the third insulating layer 52, and it may be a silicon oxide ($SiO_x$) film, a silicon nitride (SiNx) film, a silicon oxide nitride (SiOxNy; x>y) film, a silicon nitride oxide (SiNxOy; x>y) film, or the like, for example.

Then, a metal film is formed on the third insulating layer 52 and patterned, thereby obtaining the slot electrode 55 having a plurality of slots 57. The metal film may be a Cu film (or an Al film) having a thickness of 2 μm to 5 μm. Herein, a layered film obtained by layering Ti (thickness: 20 nm, for example) and Cu (thickness: 3000 nm, for example) in this order is used. Note that a layered film obtained by layering a Ti film, a Cu film and a Ti film in this order may be formed instead.

Then, a fourth insulating layer (thickness: 100 nm or 200 nm, for example) 58 is formed on the slot electrode 55 and in the slot 57. The material of the fourth insulating layer 58 may be the same as the third insulating layer. Then, in the non-transmitting/receiving region R2, an opening that reaches the slot electrode 55 is formed in the fourth insulating layer 58.

Then, a transparent conductive film is formed on the fourth insulating layer 58 and in the opening of the fourth insulating layer 58 and is patterned, thereby forming the upper connecting portion 60 that is in contact with the slot electrode 55 in the opening. Thus, the terminal portion IT is obtained.

(Variation 1)

Figure 10:
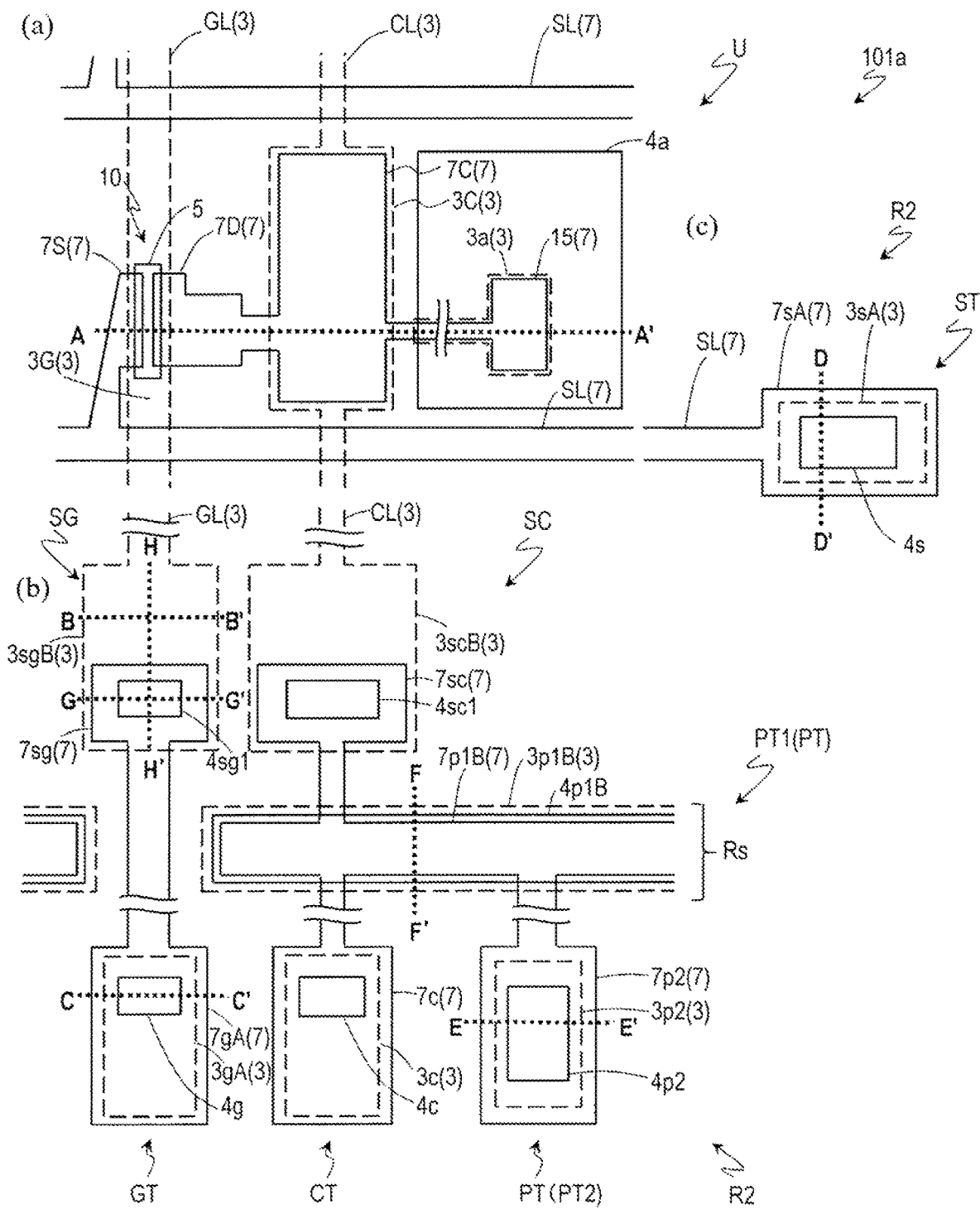

Referring to FIG. 10 and FIG. 11, the TFT substrate 101a according to Variation 1 of the present embodiment will be described. Like elements to those of the TFT substrate 101 shown in FIG. 3 to FIG. 5 are denoted by like reference signs and may not be further described below.

Portions (a) to (c) of FIG. 10 are schematic plan views showing the TFT substrate 101a. Portion (a) of FIG. 10 shows the antenna element region U of the transmitting/receiving region R1, portion (b) of FIG. 10 shows the gate terminal portion GT, the CS terminal portion CT, the transfer terminal portion PT, the gate-source connecting portion SG and the CS-source connecting portion SC provided in the non-transmitting/receiving region R2, and portion (c) of FIG. 10 shows the source terminal portion ST provided in the non-transmitting/receiving region R2.

FIGS. 11(a) to 11(d) are schematic cross-sectional views showing the TFT substrate 101a. FIG. 11(a) shows a cross section of the gate-source connecting portion SG taken alone line B-B' of portion (b) of FIG. 10, FIG. 11(b) a cross section of the first transfer terminal portion PT1 taken along line F-F' of portion (b) of FIG. 10, FIG. 11(c) a cross section of the gate-source connecting portion SG taken along line G-G' of portion (b) of FIG. 10, and FIG. 11(d) a cross section of the gate-source connecting portion SG taken along line H-H' of portion (b) of FIG. 10. Note that other cross sections of the TFT substrate 101a are the same as those of the TFT substrate 101, and will not be further shown or described below. The description below focuses on differences from the TFT substrate 101.

First transfer terminal portion PT1

As shown in portion (b) of FIG. 10 and FIG. 11(b), the first transfer terminal portion PT1 of the TFT substrate 101a includes a first transfer terminal lower connection portion 7p1B, an opening 4p1B formed in the gate insulating layer 4, and a first transfer terminal upper connection portion 3p1B.

As shown in portion (b) of FIG. 3 and FIG. 5(a), in the first transfer terminal portion PT1 of the TFT substrate 101, the opening 4p1A is located on the inner side of the lower connection portion 7p1A, as seen from the direction normal to the dielectric substrate 1. That is, the opening 4p1A is formed so as to expose only a portion of the lower connection portion 7p1A. Therefore, with the TFT substrate 101, a portion of the lower connection portion 7p1A overlaps with the upper connection portion 3p1A in the opening 4p1A, as seen from the direction normal to the dielectric substrate 1.

In contrast, as shown in portion (b) of FIG. 10 and FIG. 11(b), in the first transfer terminal portion PT1 of the TFT substrate 101a, the upper connection portion 3p1B includes a portion that does not overlap with the lower connection portion 7p1B in the opening 4p1B formed in the gate insulating layer 4, as seen from the direction normal to the dielectric substrate 1. The opening 4p1B is formed so as to expose the entire lower connection portion 7p1B. Therefore, with the TFT substrate 101a, the entire lower connection portion 7p1B overlaps with the upper connection portion 3p1B in the opening 4p1B, as seen from the direction normal to the dielectric substrate 1.

Figure 12:
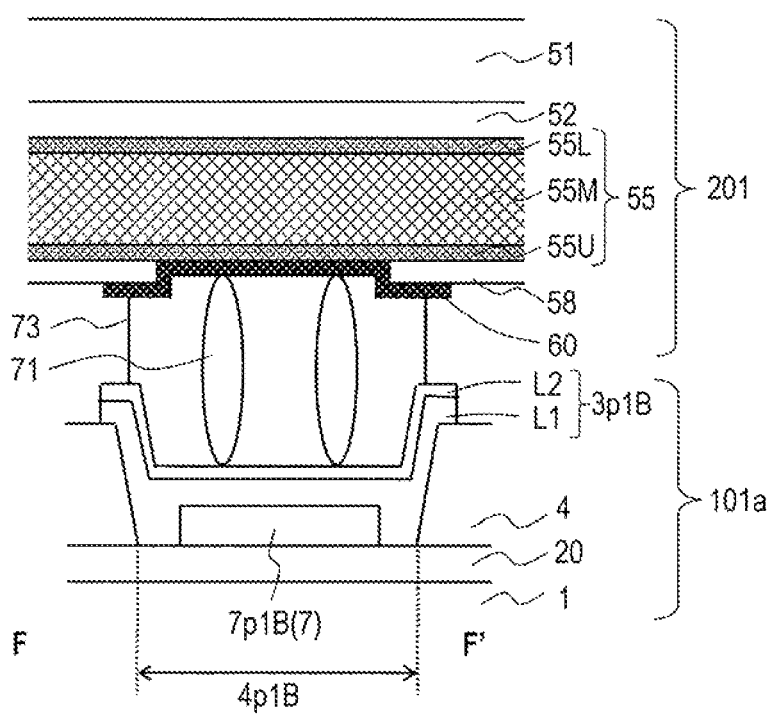
FIG. 12 is a schematic cross-sectional view illustrating a transfer portion that connects together the first transfer terminal portion PT1 of the TFT substrate 101a and the terminal portion IT of the slot substrate 201.

FIG. 12 is a schematic cross-sectional view illustrating a transfer portion that connects together the first transfer terminal portion PT1 of the TFT substrate 101a and the terminal portion IT of the slot substrate 201. With the TFT substrate 101a, as compared with the TFT substrate 101, the contact between conductive particles and the upper connection portion 3p1B is likely to be stable. The TFT substrate 101a is more advantageous than the TFT substrate 101 in that it is easier to control the thickness of the liquid crystal layer (cell gap).

Note that the TFT substrate 101a may be inferior to the TFT substrate 101 in view of the reliability of the first transfer terminal portion PT1. With the TFT substrate 101, the entire region in the opening 4p1A has a layered structure including the lower connection portion 7p1A and the upper connection portion 3p1A on the dielectric substrate 1. In the first transfer terminal portion PT1, the entire region that does not include the lower connection portion 7p1A has a layered structure including the gate insulating layer 4. In contrast, the TFT substrate 101a includes a region in the opening 4p1B, which region has a layered structure that only includes the upper connection portion 3p1B on the dielectric substrate 1 and does not include the lower connection portion 7p1B. The first transfer terminal portion PT1 of the TFT substrate 101a includes a region that has a layered structure that includes neither the lower connection portion 7p1B nor the gate insulating layer 4. This may make the TFT substrate 101a inferior in view of reliability.

Gate-source connecting portion SG, CS-source connecting portion SC

As shown in portion (b) of FIG. 10 and FIG. 11(c), the gate-source connecting portion SG of the TFT substrate 101a is different from the TFT substrate 101 in that the width of a gate bus line connecting portion 3agB is greater than the width of the gate lower connection line 7sg.

As shown in portion (b) of FIG. 10, the CS-source connection portion SG of the TFT substrate 101a is different from the TFT substrate 101 in that the width of a CS bus line connecting portion 3acB is greater than the width of the CS lower connection line 7sc.

Note that the shapes of conductive portions and openings of the TFT substrate 101a are not limited to those shown in the figures, but may be changed as necessary.

Also with the TFT substrate 101a having such a structure, it is possible to realize advantageous effects similar to those of the TFT substrate 101.

<Method for Manufacturing TFT Substrate 101a>

Referring to FIGS. 13(a) to 13(c), a method for manufacturing the TFT substrate 101a will be described. FIGS. 13(a) to 13(c) are schematic cross-sectional views illustrating a method for manufacturing the TFT substrate 101a. These figures each show cross sections of the TFT substrate 101a taken along lines A-A', B-B', C-C' and F-F'. The description below focuses on differences from the method for manufacturing the TFT substrate 101.

First, as described above with reference to FIGS. 8(a) to 8(e), the base insulating layer 20, the island-shaped semiconductor layer 5, the contact layers 68 and 6D, the source metal layer 7, the gate insulating film 4' and the gate metal layer 3 are formed on the dielectric substrate 1. Herein, in the first transfer terminal portion formation region, the source metal layer 7 includes the lower connection portion 7p1B.

Then, the gate insulating film 4' is etched by a photolithography process known in the art, thereby obtaining the gate insulating layer 4, as shown in FIG. 13(a). This step is performed similarly to the step described above with reference to FIG. 9(a). Herein, the opening 4p1B reaching the lower connection portion 7p1B is formed in the first transfer terminal portion formation region. The opening 4p1B is formed so that a portion of the region in the opening 4p1B does not overlap with the lower connection portion 7p1B, as seen from the direction normal to the dielectric substrate 1. The opening 4p1B is formed so as to expose the entire lower connection portion 7p1B.

Then, as shown in FIG. 9(b), the gate conductive film 3' is formed on the gate insulating layer 4 and in the openings formed in the gate insulating layer 4. This step is performed similarly to the step described above with reference to FIG. 9(b).

Then, the gate conductive film 3' is patterned, thereby obtaining the gate metal layer 3 as shown in FIG. 13(c). This step is performed similarly to the step described above with reference to FIG. 9(c). Herein, in the first transfer terminal portion formation region, the gate metal layer 3 includes the upper connection portion 3p1B. The upper connection portion 3p1B is connected to the lower connection portion 7p1B in the opening 4p1B.

The TFT substrate 101a is manufactured as described above.

As described above, the TFT substrate 101a can be manufactured by using four photomasks.

(Variation 2)

Figure 14:
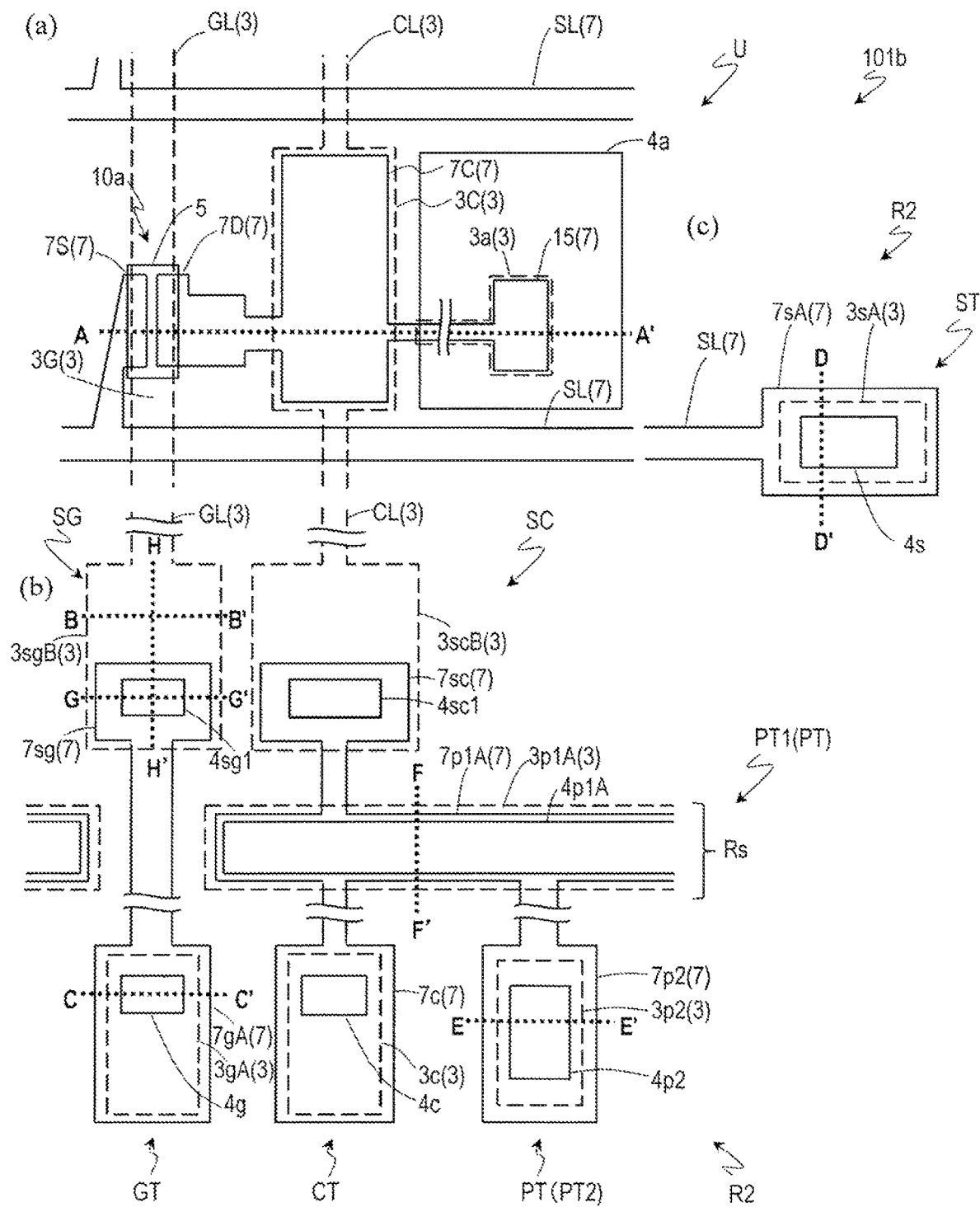
FIG. 14 is a schematic plan views showing a TFT substrate 101b according to Variation 2. Portion (a) of FIG. 14 is a schematic plan view showing an antenna element region U of the transmitting/receiving region R1 of the TFT substrate 101b, and portions (b) and (c) of FIG. 14 are schematic plan views showing the non-transmitting/receiving region R2 of the TFT substrate 101b.
Figure 15:
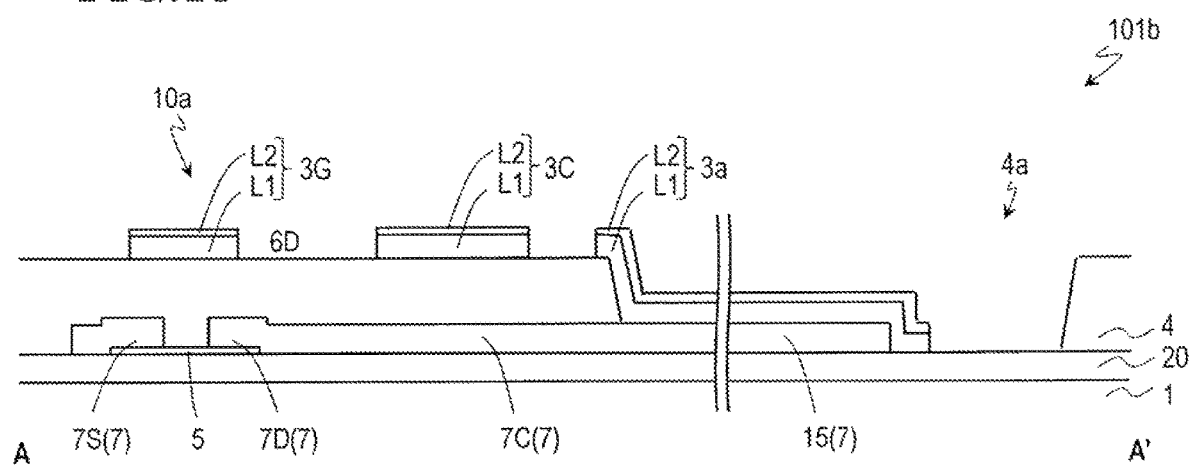
FIG. 15 is a schematic cross-sectional view showing the TFT substrate 101b.

Referring to FIG. 14 and FIG. 15, the TFT substrate 101b according to Variation 2 of the present embodiment will be described. Like elements to those of the TFT substrate 101 shown in FIG. 3 to FIG. 5 are denoted by like reference signs and may not be further described below.

Portions (a) to (c) of FIG. 14 are schematic plan views showing the TFT substrate 101b. Portion (a) of FIG. 14 shows the antenna element region U of the transmitting/receiving region R1, portion (b) of FIG. 14 shows the gate terminal portion GT, the CS terminal portion CT, the transfer terminal portion PT, the gate-source connecting portion SG and the CS-source connecting portion SC provided in the non-transmitting/receiving region R2, and portion (c) of FIG. 14 shows the source terminal portion ST provided in the non-transmitting/receiving region R2. FIG. 15 shows a cross section of the antenna element region U taken along line A-A' of portion (a) of FIG. 14. Note that other cross sections of the TFT substrate 101a are the same as those of the TFT substrate 101 or the TFT substrate 101a, and will not be further shown or described below. The description below focuses on differences from the TFT substrate 101 or the TFT 101a.

An example of the semiconductor layer 5 of the TFT 10 of the TFT substrate 101 is an amorphous silicon layer, for example. Each antenna element region U of the TFT substrate 101b includes a TFT 10a. The TFT 10a includes no contact layer between the semiconductor layer 5 and the source electrode 7S and the drain electrode 7D. For example, an oxide semiconductor layer is used as the semiconductor layer 5 of the TFT 10a.

Also with the TFT substrate 101b having such a structure, it is possible to realize advantageous effects similar to those of the TFT substrate 101.

The gate-source connecting portion SG and the CS-source connecting portion SC of the TFT substrate 101b have a similar structure to the TFT substrate 101a as shown in portion (b) of FIG. 14. Note however that the present invention is not limited to this, but a structure similar to the TFT substrate 101 may be used, for example.

<Method for Manufacturing TFT Substrate 101b>

Referring to FIGS. 16(a) to 16(e) and FIGS. 17(a) to 17(c), a method for manufacturing the TFT substrate 101b will be described. FIGS. 16(a) to 16(e) and FIGS. 17(a) to 17(c) are schematic cross-sectional views illustrating a method for manufacturing the TFT substrate 101b. These figures each show cross sections of the TFT substrate 101b taken along lines A-A', B-B', C-C' and F-F'. The description below focuses on differences from the method for manufacturing the TFT substrate 101.

First, as shown in FIG. 16(a), the base insulating layer 20 and the oxide semiconductor film 5' are formed in this order on the dielectric substrate 1. Herein, a layered film ($SiO_x$/$Si_xN_y$) obtained by layering a silicon nitride ($Si_xN_y$) film (thickness: 200 nm, for example) and a silicon oxide ($SiO_x$) film (thickness: 50 nm, for example) in this order is formed as the base insulating layer 20. An In—Ga—Zn—O-based semiconductor film having a thickness of 70 nm, for example, is formed as the oxide semiconductor film 5'.

Then, the oxide semiconductor film 5' is patterned, thereby obtaining the island-shaped semiconductor layer 5 as shown in FIG. 16(b).

Then, as shown in FIG. 16(c), the source conductive film 7' is formed on the base insulating layer 20 and the semiconductor layer 5. Herein, a layered film (Cu/Ti) obtained by layering Ti (thickness: 20 nm, for example) and Cu (thickness: 500 nm, for example) in this order is formed as the source conductive film 7'.

Then, the source conductive film 7' is patterned to obtain the source metal layer 7 as shown in FIG. 16(d). Herein, the patterning of the source conductive film 7' is performed by wet etching and dry etching. For example, after patterning the Cu film by wet etching using a mixed acid aqueous solution, the Ti film may be patterned by dry etching.

Next, as shown in FIG. 16(e), the gate insulating film 4' is formed so as to cover the source metal layer 7 and the base insulating layer 20. Herein, a layered film ($SiO_x/Si_xN_y$) obtained by layering a silicon nitride ($Si_xN_y$) film (thickness: 350 nm, for example) and a silicon oxide ($SiO_x$) film (thickness: 50 nm, for example) in this order is formed as the gate insulating film 4'. In this example, the gate insulating film 4' is arranged so as to be in contact with the channel region of the semiconductor layer 5.

Then, the gate insulating film 4' is etched by a photolithography process known in the art, thereby obtaining the gate insulating layer 4, as shown in FIG. 17(a).

Then, as shown in FIG. 17(b), the gate conductive film 3' is formed on the gate insulating layer 4 and in the openings formed in the gate insulating layer 4. Herein, a layered film (ITO/MoNbNi) obtained by layering a MoNbNi film (thickness: 300 nm, for example) and an ITO film (thickness: 70 nm, for example) in this order is formed as the gate conductive film 3'.

Then, the gate conductive film 3' is patterned, thereby obtaining the gate metal layer 3 as shown in FIG. 17(c). Herein, the patterning of the gate conductive film 3' is performed by wet etching.

Thus, the TFT 10a is obtained, and the source terminal portion ST, the gate terminal portion GT, the CS terminal portion CT, the first transfer terminal portion PT1, the second transfer terminal portion PT2, the gate-source connecting portion SG and the CS-source connecting portion SC are obtained.

The TFT substrate 101b is manufactured as described above.

As stated above, the TFT substrate 101b can be manufactured by using four photomasks.

(Variation 3)

Figure 18:
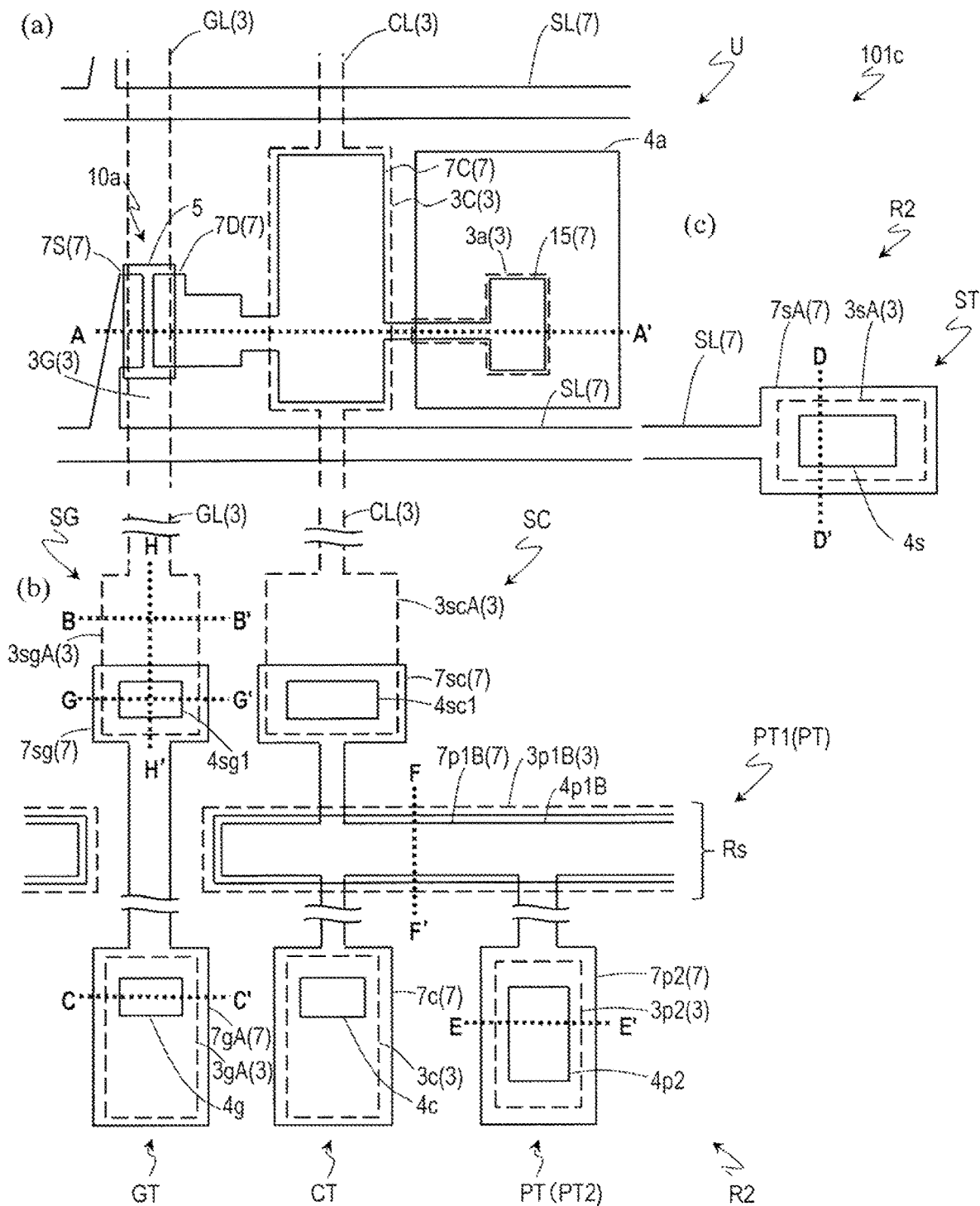
FIG. 18 is a schematic plan view showing a TFT substrate 101c according to Variation 3. Portion (a) of FIG. 18 is a schematic plan view showing an antenna element region U of the transmitting/receiving region R1 of the TFT substrate 101c, and portions (b) and (c) of FIG. 18 are schematic plan views showing the non-transmitting/receiving region R2 of the TFT substrate 101c.

Referring to FIG. 18, the TFT substrate 101c according to Variation 3 of the present embodiment will be described. Like elements to those of the TFT substrate 101b shown in FIG. 14 and FIG. 15 are denoted by like reference signs and may not be further described below.

Portions (a) to (c) of FIG. 18 are schematic plan views showing the TFT substrate 101c. Portion (a) of FIG. 18 shows the antenna element region U of the transmitting/receiving region R1, portion (b) of FIG. 18 shows the gate terminal portion GT, the CS terminal portion CT, the transfer terminal portion PT, the gate-source connecting portion SG and the CS-source connecting portion SC provided in the non-transmitting/receiving region R2, and portion (c) of FIG. 18 shows the source terminal portion ST provided in the non-transmitting/receiving region R2. Note that cross sections of the TFT substrate 101c are the same as those of the TFT substrates 101, 101a and 101b described above, and will not be further shown or described below.

The gate-source connecting portion SG and the CS-source connecting portion SC of the TFT substrate 101c have a similar structure to the TFT substrate 101 as shown in portion (b) of FIG. 18. Note however that the present invention is not limited to this, but a structure similar to the TFT substrate 101b may be used, for example.

The first transfer terminal portion PT1 of the TFT substrate 101c has a similar structure to the TFT substrate 101a, as shown in portion (b) of FIG. 18. Note however that the present invention is not limited to this, but a structure similar to the TFT substrate 101b may be used, for example.

Also with the TFT substrate 101c having such a structure, it is possible to realize advantageous effects similar to those of the TFT substrate 101.

Such a TFT substrate 101c can be manufactured by changing the patterning shapes of the source metal layer 7, the gate insulating layer 4 and the gate metal layer 3 from those of the method for manufacturing the TFT substrate 101b. The TFT substrate 101c can also be manufactured by using four photomasks.

<Material and Structure of TFT>

In the embodiment of the present invention, a TFT using the semiconductor layer 5 as the active layer is used as a switching element arranged in each pixel. The semiconductor layer 5 is not limited to an amorphous silicon layer, but may be a polysilicon layer or an oxide semiconductor layer.

When an oxide semiconductor layer is used, the oxide semiconductor included in the oxide semiconductor layer may be an amorphous oxide semiconductor or a crystalline oxide semiconductor having a crystalline portion. Examples of the crystalline oxide semiconductor include a polycrystalline oxide semiconductor, a microcrystalline oxide semiconductor, a crystalline oxide semiconductor whose c-axis is oriented generally vertical to the layer surface, etc.

The oxide semiconductor layer may have a layered structure of two or more layers. When the oxide semiconductor layer has a layered structure, the oxide semiconductor layer may include an amorphous oxide semiconductor layer and a crystalline oxide semiconductor layer. Alternatively, it may include a plurality of crystalline oxide semiconductor layers having different crystalline structures. Alternatively, it may include a plurality of amorphous oxide semiconductor layers. When the oxide semiconductor layer has a 2-layer structure including an upper layer and a lower layer, the energy gap of the oxide semiconductor included in the upper layer is preferably greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure and the deposition method of the amorphous oxide semiconductor, those of the crystalline oxide semiconductors described above, and the structure of the oxide semiconductor layer having a layered structure, etc., are described in Japanese Laid-Open Patent Publication No. 2014-007399, for example. The entire disclosure of Japanese Laid-Open Patent Publication No. 2014-007399 is herein incorporated by reference.

The oxide semiconductor layer may include at least one metal element from among In, Ga and Zn, for example. In the present embodiment, the oxide semiconductor layer includes an In—Ga—Zn—O-based semiconductor (e.g., indium gallium zinc oxide), for example. Herein, the In—Ga—Zn—O-based semiconductor is a ternary oxide of In (indium), Ga (gallium) and Zn (zinc), and there is no particular limitation on the ratio (composition ratio) between In, Ga and Zn, e.g., In:Ga:Zn=2:2:1, In:Ga:Zn=1:1:1, In:Ga:Zn=1:1:2, etc. Such an oxide semiconductor layer may be formed from an oxide semiconductor film including an In—Ga—Zn—O-based semiconductor.

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally vertical to the layer surface, etc.

Note that the crystalline structure of the crystalline In—Ga—Zn—O-based semiconductor is disclosed for example in Japanese Laid-Open Patent Publication No. 2014-007399, Japanese Laid-Open Patent Publication No. 2012-134475, Japanese Laid-Open Patent Publication No. 2014-209727, etc., mentioned above. The entire disclosures of Japanese Laid-Open Patent Publication No. 2012-134475 and Japanese Laid-Open Patent Publication No. 2014-209727 are herein incorporated by reference. A TFT including an In—Ga—Zn—O-based semiconductor layer, which has a high mobility (greater than 20 times that of an a-Si TFT) and a lower leak current (less than 1/100 that of an a-Si TFT), can suitably be used as a driver TFT (e.g., a TFT included in the driving circuit provided in the non-transmitting/receiving region) and a TFT provided in each antenna element region.

The oxide semiconductor layer may include any other oxide semiconductor instead of an In—Ga—Zn—O-based semiconductor. For example, it may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin) and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, etc.

In the example shown in FIG. 3, the TFT 10 is a channel-etched-type TFT having a top gate structure. In a "channel-etched-type TFT", there is no etch-stop layer over the channel region, and the lower surfaces of the channel-side end portions of the source and drain electrodes are arranged so as to be in contact with the upper surface of the semiconductor layer. A channel-etched-type TFT is formed for example by forming a source-drain electrode conductive film on a semiconductor layer, and performing a source-drain separation. In the source-drain separation step, the surface portion of the channel region may be etched.

Note that the TFTs 10 and 10a may each be an etch-stop-type TFT in which an etch-stop layer is formed over the channel region. In an etch-stop-type TFT, the lower surfaces of the channel-side end portions of the source and drain electrodes are located over the etch-stop layer, for example. An etch-stop-type TFT is formed for example by forming an etch-stop layer covering a portion of a semiconductor layer that is to be the channel region, then forming a source-drain electrode conductive film over the semiconductor layer and the etch-stop layer, and performing a source-drain separation. Note however that with a TFT substrate including etch-stop-type TFTs, the number of photomasks needed for manufacturing the TFT substrate increases by the number of photomasks for forming the etch-stop layer.

While the TFTs 10 and 10a each have a top contact structure in which the source and drain electrodes are in contact with the upper surface of the semiconductor layer, the source and drain electrodes may be arranged so as to be in contact with the lower surface of the semiconductor layer (bottom contact structure).

<Examples of Antenna Element Arrangement and Gate Bus Line and Source Bus Line Connection>

In the scanned antenna of the embodiment of the present invention, the antenna elements are arranged in a concentric pattern, for example.

For example, when they are arranged along m concentric circles, one gate bus line is provided for each circle, for example, i.e., a total of m gate bus lines. Where the outer diameter of the transmitting/receiving region R1 is 800 mm, for example, m is 200, for example. Where the innermost gate bus line is denoted as $1^{st}$, n (e.g., 30) antenna elements are connected to the $1^{st}$ gate bus line while nx (e.g., 620) antenna elements are connected to the $m^{th}$ gate bus line.

With such an arrangement, the number of antenna elements connected to each gate bus line varies. While m antenna elements are connected to n source bus lines that are also connected to antenna elements forming the innermost circle (of the nx source bus lines connected to nx antenna elements forming the outermost circle), the number of antenna elements connected to the other source bus lines is less than m.

Thus, the arrangement of antenna elements in a scanned antenna is different from the arrangement of pixels (dots) in an LCD panel, in that the number of antenna elements connected varies from one gate bus line and/or source bus line to another. Therefore, if the capacitance (liquid crystal capacitor+ storage capacitor) is the same for all the antenna elements, the electric load connected will vary from one gate bus line and/or source bus line to another. Then, there is a problem that voltages written to antenna elements vary.

In order to prevent this, it is preferred that substantially the same electric load is connected to each gate bus line and source bus line by, for example, adjusting the capacitance value of the storage capacitor or by adjusting the number of antenna elements connected to the gate bus line and/or source bus line.

The scanned antenna of the embodiment of the present invention is accommodated in a plastic casing, for example. It is preferred that a material having a small dielectric constant $\varepsilon_M$ that does not affect the transmission/reception of microwaves is used for the casing. A through hole may be provided in a portion of the casing that corresponds to the transmitting/receiving region R1. Moreover, a light-blocking structure may be provided so that the liquid crystal material is not exposed to light. The light-blocking structure is provided so as to, for example, block light coming from the side surface of the dielectric substrate 1 of the TFT substrate 101 and/or the side surface of the dielectric substrate 51 of the slot substrate 201 and propagating through the inside of the dielectric substrates 1 and/or 51 to enter the liquid crystal layer. Some liquid crystal materials having high dielectric anisotropies $\Delta\varepsilon_M$ are easily deteriorated by light, and it is preferred to block not only ultraviolet light but also blue light which has a short wavelength among visible light. By using a light-blocking tape such as a black adhesive tape, for example, the light-blocking structure can be easily formed at a position where it is needed.

The embodiment of the present invention can be used for scanned antennas for use in satellite communications or satellite broadcasting that are mounted on a vehicle (e.g., a ship, an aircraft, an automobile), and for manufacturing the same, for example.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Application No. 2017-185917 filed on Sep. 27, 2017, the entire content of which is hereby incorporated by reference.

What is claimed is:

1. A TFT substrate comprising:
   a dielectric substrate;
   a plurality of antenna element regions arranged on the dielectric substrate, wherein each of the plurality of antenna element regions includes a TFT and a patch electrode electrically connected to a drain electrode of the TFT;
   a transmitting/receiving region including the plurality of antenna element regions;
   a non-transmitting/receiving region located outside of the transmitting/receiving region;
   a source metal layer supported by the dielectric substrate and including a source electrode of the TFT, the drain electrode and a source bus line connected to the source electrode;
   a gate metal layer formed on the source metal layer and including a gate electrode of the TFT and a gate bus line connected to the gate electrode;
   a semiconductor layer of the TFT supported by the dielectric substrate; and
   a gate insulating layer formed between the semiconductor layer and the gate metal layer, wherein:
   the patch electrode includes a first electrode portion included in the source metal layer;
   the TFT substrate further includes a source terminal portion arranged in the non-transmitting/receiving region;
   the source terminal portion includes:
      a source terminal lower connection portion included in the source metal layer and electrically connected to the source bus line;
      a first opening formed in the gate insulating layer and reaching the source terminal lower connection portion; and
      a source terminal upper connection portion connected to the source terminal lower connection portion in the first opening;
   the gate metal layer further includes the source terminal upper connection portions;
   the gate insulating layer has a second opening exposing the first electrode portion; and
   the patch electrode further includes a second electrode portion on the first electrode portion, the second electrode portion being included in the gate metal layer.

2. The TFT substrate of claim 1, wherein the gate metal layer includes a first conductive layer and a second conductive layer formed on the first conductive layer and including a transparent conductive layer, wherein the first conductive layer is formed of a single layer or a layered structure of two or more layers selected from the group consisting of a MoNbNi layer, a MoNb layer, a MoW layer, a W layer, a Ta layer and a Ti layer.

3. The TFT substrate of claim 2, wherein:
   the source terminal upper connection portion includes the first conductive layer and the second conductive layer; and
   a side surface of the first conductive layer of the source terminal upper connection portion and a side surface of the second conductive layer of the source terminal upper connection portion are aligned with each other.

4. The TFT substrate of claim 1, wherein:
   the gate metal layer includes a first conductive layer and a second conductive layer formed on the first conductive layer and including a transparent conductive layer, wherein
   the first conductive layer is formed of a single layer or a layered structure of two or more layers selected from the group consisting of a MoNbNi layer, a MoNb layer, a MoW layer, a W layer, a Ta layer and a Ti layer; the second electrode portion includes the first conductive layer and the second conductive layer; and
   a side surface of the first conductive layer of the second electrode portion and a side surface of the second conductive layer of the second electrode portion are aligned with each other.

5. The TFT substrate of claim 1, further comprising:
   a gate-source connection portion arranged in the nontransmitting/receiving region, wherein:
   the gate-source connection portion includes:
      a gate lower connection line included in the source metal layer and electrically separated from the source bus line;
      a third opening formed in the gate insulating layer so as to reach the gate lower connection line; and
      a gate bus line connecting portion included in the gate metal layer, electrically connected to the gate bus line, and connected to the gate lower connection line in the third opening.

6. The TFT substrate of claim 5, further comprising:
   a gate terminal portion arranged in the nontransmitting/receiving region, wherein:
   the gate terminal portion includes:
      a gate terminal lower connection portion included in the source metal layer and electrically connected to the gate lower connection line;
      a fourth opening formed in the gate insulating layer so as to reach the gate terminal lower connection portion; and
      a gate terminal upper connection portion included in the gate metal layer and connected to the gate terminal lower connection portion in the fourth opening.

7. A scanned antenna comprising:
   the TFT substrate of claim 1;
   a slot substrate arranged so as to oppose the TFT substrate;
   a liquid crystal layer provided between the TFT substrate and the slot substrate; and
   a reflective conductive plate arranged so as to oppose a surface of the slot substrate that is opposite to the liquid crystal layer with a dielectric layer interposed therebetween, wherein:
   the TFT substrate further includes a first alignment film covering the gate metal layer; the slot substrate includes a further dielectric substrate, a slot electrode formed on a surface of the further dielectric substrate that is on a side of the liquid crystal layer, and a second alignment film covering the slot electrode; and
   the slot electrode includes a plurality of slots, and the plurality of slots are arranged so as to respectively correspond to the patch electrodes in the plurality of antenna element regions of the TFT substrate.

8. A method for manufacturing the TFT substrate of claim 1, comprising:
   a step A of forming a source conductive film on the dielectric substrate;
   a step B of patterning the source conductive film, thereby forming the source metal layer;

a step C of depositing a gate insulating film covering the source metal layer;

a step D of etching the gate insulating film, thereby obtaining the gate insulating layer;

a step E of forming a gate conductive film on the gate insulating layer; and a step F of patterning the gate conductive film, thereby forming the gate metal layer.

9. A method for manufacturing a TFT substrate of claim 8, wherein:

the step E comprises a step of forming a first conductive film on the gate insulating layer and a step of forming a second conductive film on the first conductive film; and the step F comprises a step of etching the first conductive film and the second conductive film using the same etching mask.

10. A method for manufacturing a TFT substrate of claim 9, wherein:

the first conductive film is formed of a single film or a layered structure of two or more films selected from the group consisting of a MoNbNi film, a MoNb film, a MoW film, a W film, a Ta film and a Ti film; and the second conductive film includes a transparent conductive film.

11. The TFT substrate of claim 1, wherein:

as seen from a direction normal to the dielectric substrate, an outer edge of the second electrode portion is outside an outer edge of the first electrode portion.

* * * * *